(12) United States Patent
Oya et al.

(10) Patent No.: US 8,698,195 B2
(45) Date of Patent: Apr. 15, 2014

(54) SEMICONDUCTOR DEVICE

(75) Inventors: Daisuke Oya, Chiyoda-ku (JP);
Katsumi Nakamura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 56 days.

(21) Appl. No.: 13/329,727

(22) Filed: Dec. 19, 2011

(65) Prior Publication Data
US 2012/0267680 A1    Oct. 25, 2012

(30) Foreign Application Priority Data

Apr. 19, 2011  (JP) .................................. 2011-093121

(51) Int. Cl.
  *H01L 29/66*    (2006.01)
(52) U.S. Cl.
  USPC .................... 257/139; 257/133; 257/E29.201
(58) Field of Classification Search
  CPC .................................................. H01L 29/739
  USPC .......... 257/133, 139, E29.201, E20.201, 339; 438/138
  See application file for complete search history.

(56) References Cited

U.S. PATENT DOCUMENTS

| 2010/0244091 | A1* | 9/2010 | Yoneda et al. ................ 257/139 |
| 2011/0012195 | A1* | 1/2011 | Momota et al. ............... 257/334 |
| 2011/0220962 | A1* | 9/2011 | Koyama et al. ............... 257/139 |

FOREIGN PATENT DOCUMENTS

| DE | 10 2008 052 422 A1 | 12/2009 | | |
| JP | 8-167711 | 6/1996 | | |
| JP | 9-331063 | 12/1997 | | |
| JP | 11-330466 | 11/1999 | | |
| JP | 2001-244325 | 9/2001 | | |
| JP | 2002-16252 | 1/2002 | | |
| JP | 2010-10556 | 1/2010 | | |
| JP | 2010-135677 A | 6/2010 | | |
| KR | 2002-0086655 | 11/2002 | | |
| WO | WO 02/058160 | 7/2002 | | |
| WO | WO2009/096412 A1 | * | 6/2009 | .............. H01L 29/78 |
| WO | WO 2011/111500 A1 | 9/2011 | | |

OTHER PUBLICATIONS

M. Takei, et al., "Analysis of IPM Current Oscillation under Short Circuit Condition", Proceedings of 1998 International Symposium on Power Semiconductor Devices & ICs, (Kyoto), Jun. 3-6, 1998, pp. 88-93 (with Cover pages).
Office Action issued Aug. 1, 2013, in German Patent Application No. 10 2012 204 420.5 (with English-language translation).
Office Action issued Oct. 30, 2013 in Korean Application No. 10-2012-0034266 (With English Translation).

* cited by examiner

*Primary Examiner* — Caridad Everhart
(74) *Attorney, Agent, or Firm* — Oblon, Spivak, McClelland, Maier & Neustadt, L.L.P.

(57) ABSTRACT

A stabilizing plate portion is formed in a region of a first main surface lying between first and second insulated gate field effect transistor portions. The stabilizing plate portion includes a first stabilizing plate arranged closest to the first insulated gate field effect transistor portion and a second stabilizing plate arranged closest to the second insulated gate field effect transistor portion. An emitter electrode is electrically connected to an emitter region of each of the first and second insulated gate field effect transistor portions, electrically connected to each of the first and second stabilizing plates, and arranged on the entire first main surface lying between the first and second stabilizing plates, with an insulating layer being interposed.

11 Claims, 25 Drawing Sheets

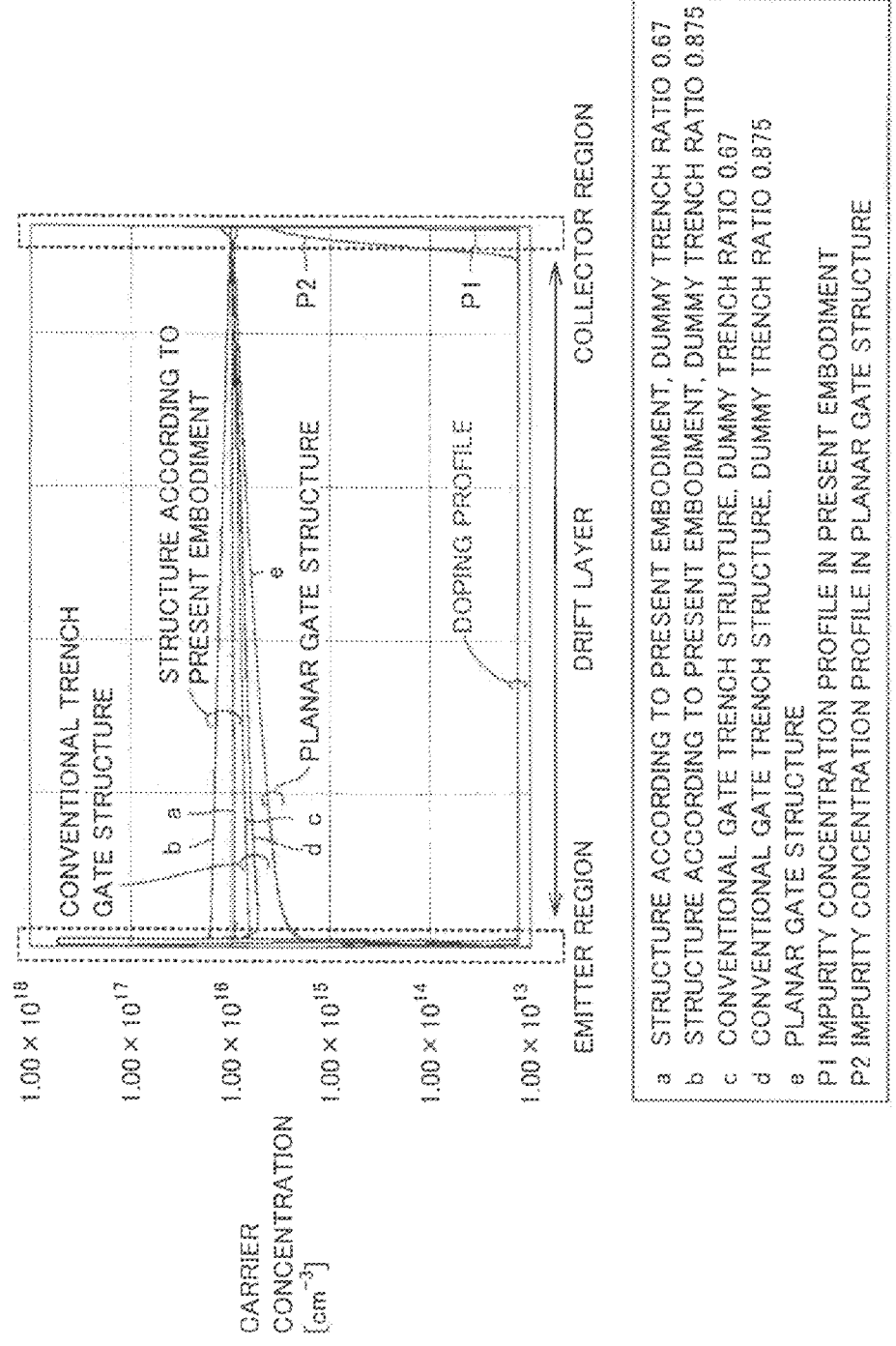

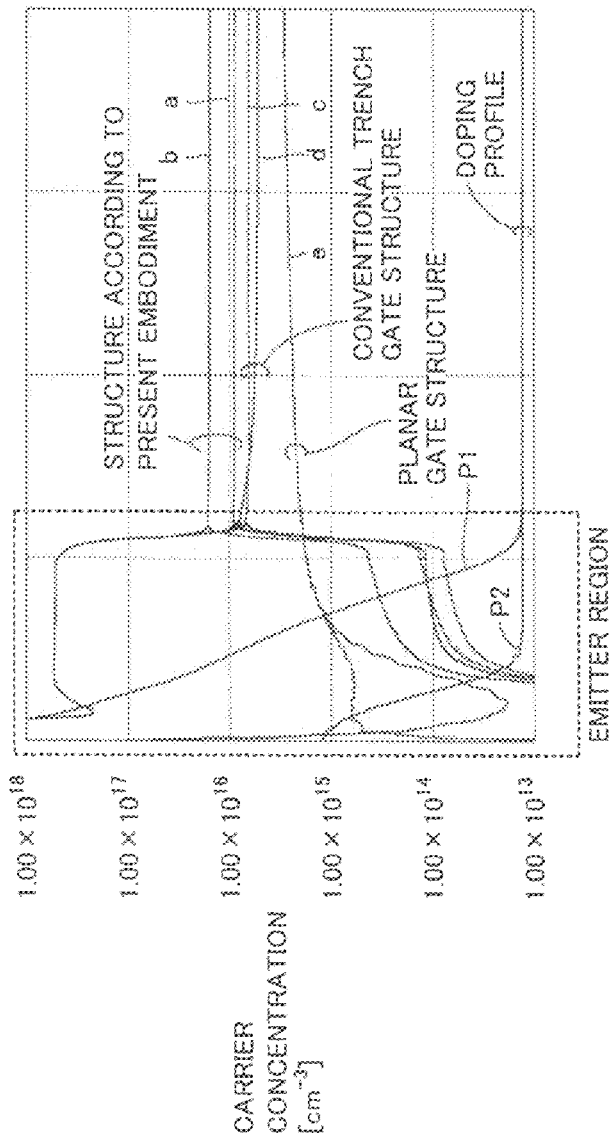

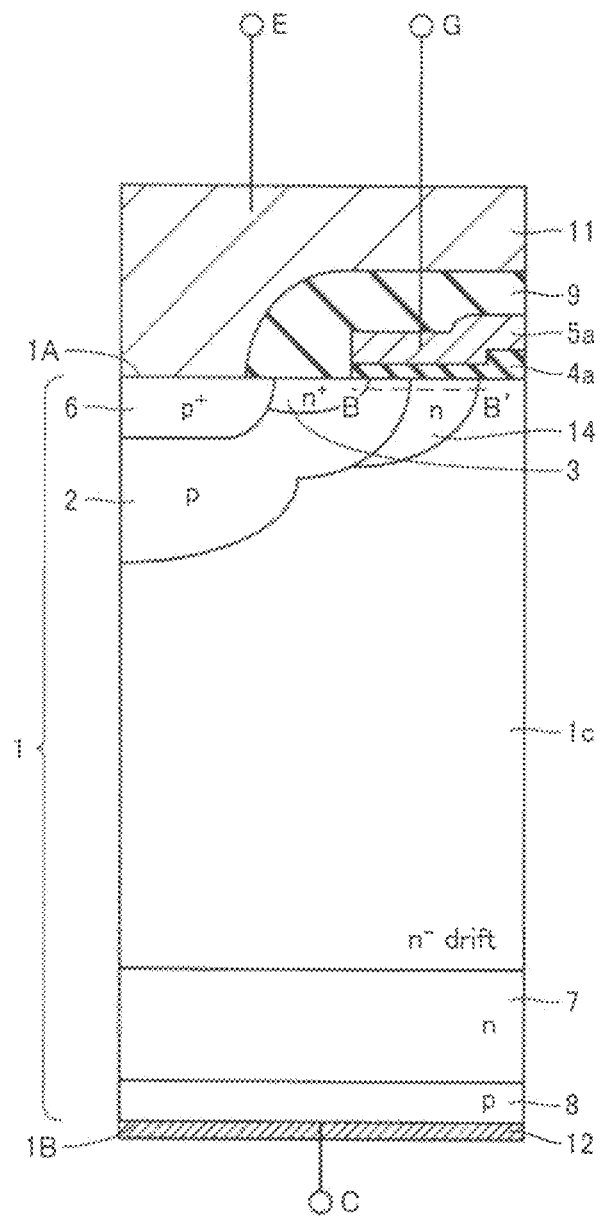

SEMICONDUCTOR DEVICE

BACKGROUND OF THE INVENTION

1. Field of the Invention

The present invention relates to a semiconductor device, and particularly to a semiconductor device having at least two insulated gate field effect transistor portions for allowing a main current to flow between opposing main surfaces of a semiconductor substrate.

2. Description of the Background Art

In the field of a high withstand-voltage semiconductor device for controlling a voltage exceeding several hundred V, a current handled thereby is also high and hence element characteristics achieving suppressed heat emission, that is, loss, are required. In addition, as a method for driving a gate for controlling such a voltage and current, a voltage driven element having a small drive circuit and being low in loss therein is desirable.

For the reasons as described above, currently in this field, an insulated gate bipolar transistor, that is, an IGBT, has become mainstream as an element that can be driven with a voltage and be low in loss. A structure of this IGBT is a structure that can be regarded as keeping a withstand voltage by lowering impurity concentration in a drain of a MOS (Metal Oxide Semiconductor) transistor and having a drain side as a diode in order to lower drain resistance.

In such an IGBT, since the diode performs a bipolar operation, a source of the MOS transistor of the IGBT is herein called an emitter and the drain side is called a collector side.

In the IGBT representing a voltage driven element, generally, a voltage of several hundred V is applied across the collector and the emitter and the voltage is controlled by a gate voltage from ±several V to several ten V. In many cases, an IGBT is used as a switching element in an inverter. While the IGBT is in an ON state, a high current flows between the collector and the emitter and a voltage across the collector and the emitter becomes lower. While the IGBT is in an OFF state, little current flows between the collector and the emitter and a voltage across the collector and the emitter becomes higher.

Normally, as an IGBT operates as described above, loss in the IGBT can be categorized into ON-state power dissipation which is a product of a current and a voltage during the ON state and switching loss at the time of transition at which switching between the ON state and the OFF state is made. Since a product of leakage current and voltage during the OFF state is very small, it is ignorable.

On the other hand, even in an abnormal state such as short-circuiting of a load, it is important also to prevent an element from breaking down. In such a case, a gate is turned on while a power supply voltage of several hundred V is applied across the collector and the emitter and a high current flows.

In an IGBT having such a structure that a MOS transistor and a diode are connected in series, a maximum current is restricted by a saturation current of the MOS transistor. Therefore, even at the time of short-circuiting as above, a current is restricted and breakdown of an element due to heat emission can be prevented for a certain period of time.

In a recent IGBT, in order to further decrease loss, a trench gate type IGBT adopting a trench gate made by forming a trench in a surface of an element and embedding a gate electrode therein has become mainstream (see, for example, Japanese Patent Laying-Open Nos. 9-331063, 8-167711, 11-330466, 2010-10556, 2002-16252, and 2001-244325). Since a trench gate type IGBT is an element in which a MOS transistor portion has been reduced in size, its gate capacitance has been increased. In addition, a saturation current becomes very high at the time of short-circuiting, and therefore heat emission is great and the IGBT tends to break down in a short period of time.

Moreover, in recent years, as described, for example, in a document "Proceedings of 1998 International Symposium on Power Semiconductor Devices & ICs, p. 89." such a phenomenon that oscillation occurs in a gate voltage, a gate current, a collector/emitter voltage, and a collector current at the time of short-circuiting due to a feedback capacitance of an IGBT which results in a malfunction has been known. Such an oscillation phenomenon due to a feedback capacitance has become a serious problem in an element having a large gate capacitance such as a trench gate type IGBT.

In order to address such problems, a structure in which a gate capacitance is suppressed by employing a dummy trench which is a trench not electrically connected to a gate electrode has been proposed. Further, WO02/058160 has proposed a structure allowing suppression of oscillation at the time of short-circuiting.

In the conventional examples above, as a ratio of dummy trenches (hereinafter referred to as a stabilizing plate or a trench for stabilizing plate) is increased in a high withstand-voltage semiconductor device such as a trench gate type IGBT in order to suppress oscillation at the time of short-circuiting, an ON voltage (Vce(sat)) and ON-state power dissipation increase and hence the number of dummy trenches cannot sufficiently be increased.

SUMMARY OF THE INVENTION

The present invention was made in view of the above-described problems, and an object of the present invention is to provide a semiconductor device capable of achieving a low ON voltage and readily improving short-circuit capability even when a ratio of trenches for stabilizing plate is increased for the purpose of suppression of oscillation at the time of short-circuiting.

A semiconductor device according to the present invention includes a semiconductor substrate, first and second insulated gate field effect transistor portions, a stabilizing plate portion, and an emitter electrode. The semiconductor substrate has a first main surface and a second main surface opposed to each other. The first and second insulated gate field effect transistor portions each have an insulated gate structure on a side of the first main surface and an emitter region of a first conductivity type formed in the first main surface, and allow a main current to flow between the first main surface and the second main surface. The stabilizing plate portion is formed in a region in the first main surface lying between the first and second insulated gate field effect transistor portions. The emitter electrode is provided on the first main surface. The stabilizing plate portion includes a first stabilizing plate arranged closest to the first insulated gate field effect transistor portion and a second stabilizing plate arranged closest to the second insulated gate field effect transistor portion. The emitter electrode is electrically connected to the emitter region of each of the first and second insulated gate field effect transistor portions, electrically connected to each of the first and second stabilizing plates, and arranged on the entire first main surface lying between the first and second stabilizing plates with an insulating layer being interposed.

According to the present invention, the emitter electrode is arranged on the entire first main surface lying between the first and second stabilizing plates with the insulating layer being interposed. Namely, the emitter electrode is not connected to the first main surface lying between the first and second stabilizing plates through a contact hole. Therefore, during the ON state, little current flows in the stabilizing plate portion and flows in the insulated gate field effect transistor portion in a concentrated manner, whereby an ON voltage is lowered.

In addition, owing to a connection structure between the stabilizing plate and the emitter electrode in the semiconductor device according to the present invention, a transistor portion can be reduced in size. Therefore, a current flows to the transistor portion in a further concentrated manner and thus the ON voltage can further be lowered. Since the semiconductor device can be reduced in size, a ratio of the trench for stabilizing plate can readily be increased. Therefore, the ON voltage can further be lowered, reduction in an effective gate width is also facilitated, a saturation current is lowered, and short-circuit capability can be improved. Furthermore, according to the connection structure between the stabilizing plate and the emitter electrode in the semiconductor device of the present invention, since the stabilizing plate can be set to an emitter potential even though the semiconductor device is reduced in size, a gate capacitance can be decreased and oscillation at the time of short-circuiting can be suppressed.

As described above, a semiconductor device capable of achieving a lower ON voltage and readily improving short-circuit capability can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a diagram showing carrier concentration distribution in each device structure.

FIG. 15 is an enlarged view of an emitter region side in FIG. 14.

FIG. 28 is a cross-sectional view of an IGBT having a planar gate structure.

DESCRIPTION OF THE PREFERRED EMBODIMENTS

Figure 1:
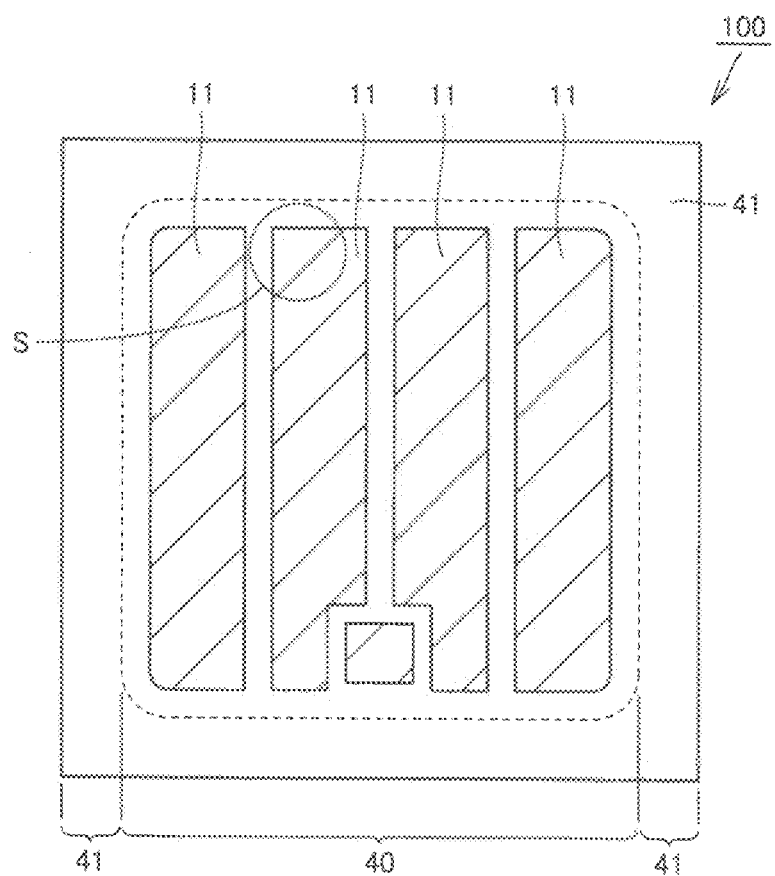
FIG. 1 is a schematic plan view schematically showing a construction of a chip state of a semiconductor device in a first embodiment of the present invention.

A semiconductor device in an embodiment according to the present invention will be described hereinafter with reference to the drawings. When the number, an amount, or the like is mentioned in the embodiment described below, the scope of the present invention is not necessarily limited to the number, the amount, or the like, unless otherwise specified. In addition, the same or corresponding elements have the same reference characters allotted and redundant description may not be repeated.

First Embodiment

A construction of a semiconductor device in the present embodiment will initially be described with reference to FIGS. 1 to 6.

Referring first to FIG. 1, when a semiconductor chip 100 is viewed two-dimensionally, an IGBT formation region 40 is formed in a central portion of semiconductor chip 100 and an edge termination region 41 is arranged to surround IGBT formation region 40. A plurality of emitter electrodes 11 are formed in IGBT formation region 40.

Figure 2:
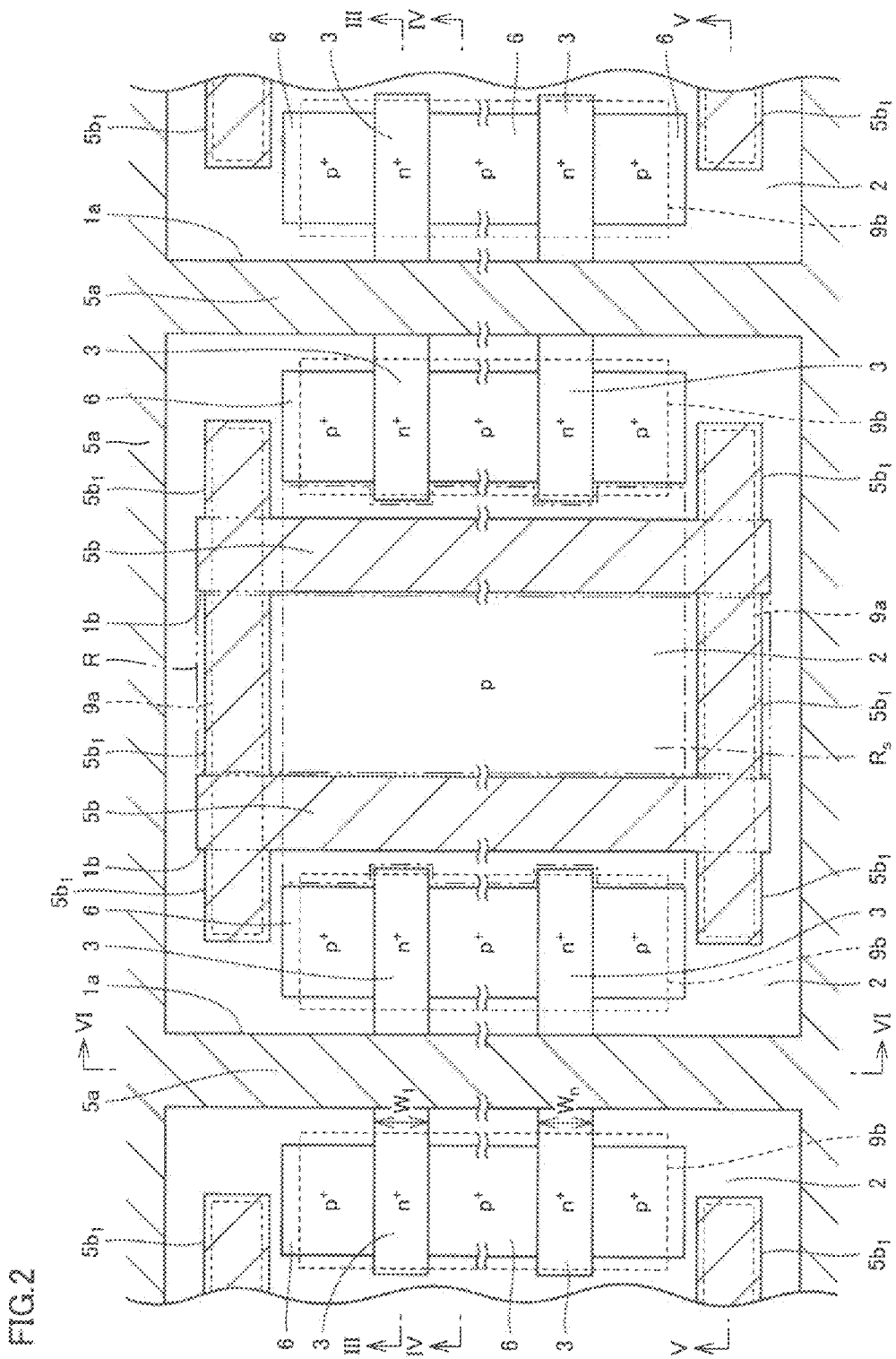
FIG. 2 is a partial plan view schematically showing a construction of the semiconductor device in the first embodiment of the present invention, showing a region S in FIG. 1 as enlarged.
Figure 3:
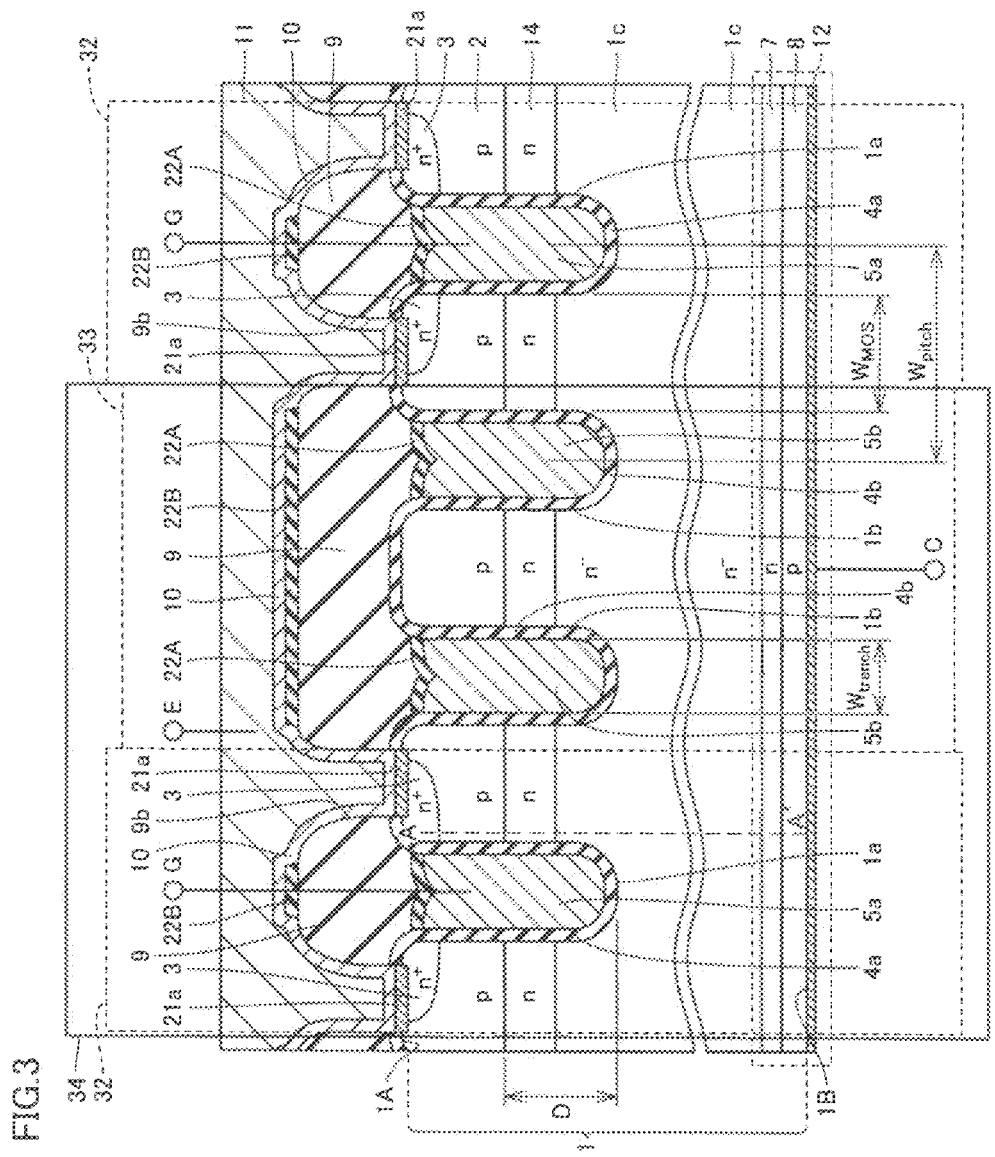
FIG. 3 is a cross-sectional view along the line in FIG. 2 when viewed in a direction of an arrow.

Referring mainly to FIGS. 2 and 3, this semiconductor device is a trench gate type IGBT formed on a semiconductor substrate 1 having a thickness, for example, from 40 μm to 700 μm. Semiconductor substrate 1 has a first main surface (an upper surface) 1A and a second main surface (a lower surface) 1B opposed to each other. A silicon substrate serving as semiconductor substrate 1 has an n⁻ region (an n⁻ drift region) 1c (a first region) having impurity concentration, for example, from about $1 \times 10^{12}$ to $1 \times 10^{16}$ cm⁻³.

In semiconductor substrate 1 on a first main surface 1A side of this n⁻ region 1c, a p-type body region 2 having concentration, for example, from about $1 \times 10^{16}$ to $1 \times 10^{18}$ cm⁻³, located at a depth of about 3 μm from first main surface 1A, and composed of a p-type semiconductor is formed. An n-type impurity diffusion region 14 (a second region) higher in impurity concentration than n⁻ region 1c and lower in impurity concentration than p-type body region 2 is formed between n⁻ region 1c and p-type body region 2. In p-type body region 2 in first main surface 1A, an n-type emitter region 3 having concentration, for example, not lower than $1 \times 10^{19}$ cm⁻³, located at a depth of about 0.5 μm from first main surface 1A, and composed of an n-type semiconductor is formed.

Figure 4:
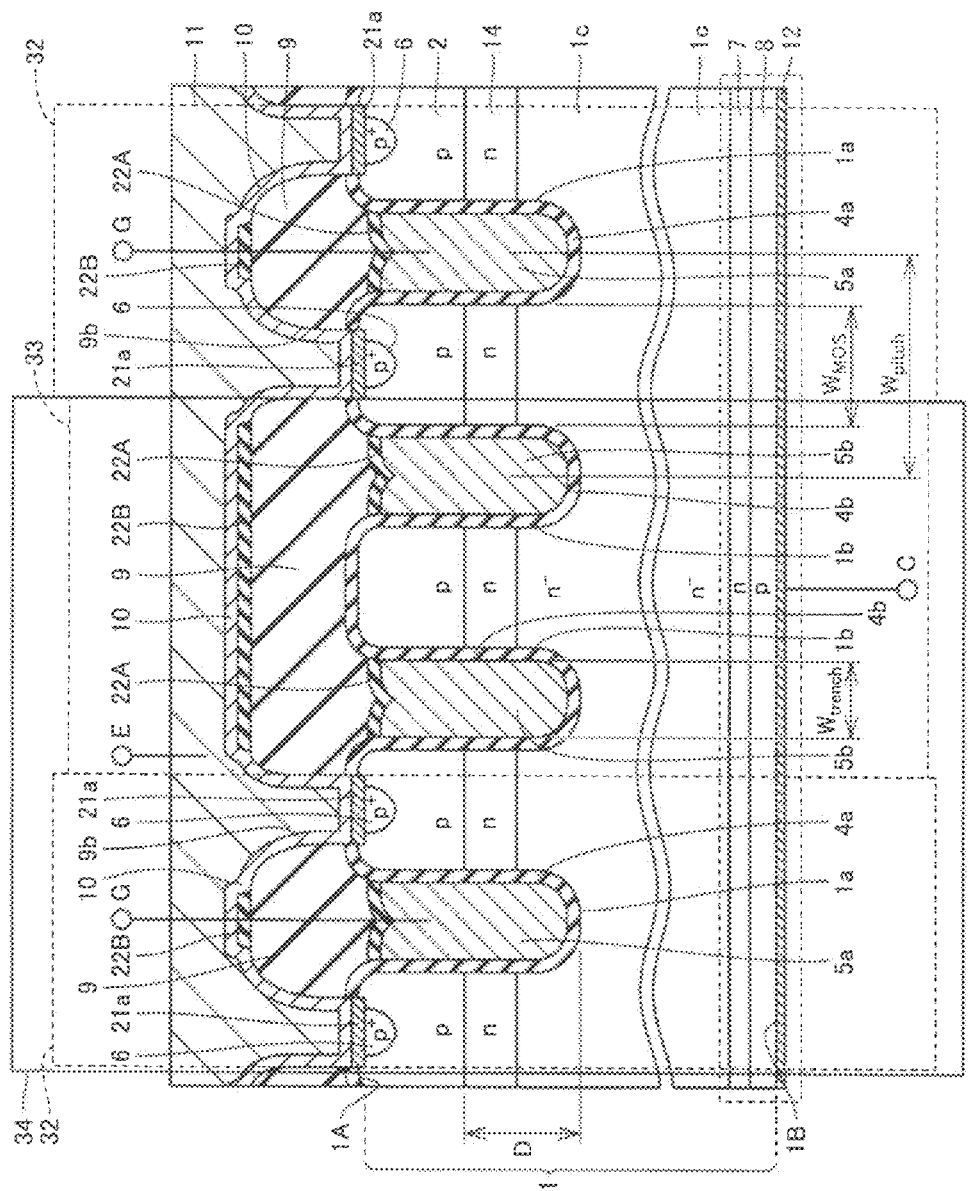
FIG. 4 is a cross-sectional view along the line IV-IV in FIG. 2 when viewed in a direction of an arrow.

Referring mainly to FIGS. 2 and 4, in first main surface 1A, a p⁺ impurity diffusion region (a p⁺ body contact region) 6 at concentration, for example, around $1 \times 10^{20}$ cm⁻³ for establishing low-resistance contact with p-type body region 2 is formed adjacent to n-type emitter region 3.

Referring mainly to FIGS. 3 and 4, in first main surface 1A of semiconductor substrate 1, a trench for gate 1a reaching n⁻ region 1c through p-type body region 2 and n-type impurity diffusion region 14 is formed. This trench for gate 1a has a depth, for example, from 3 μm to 10 μm from first main surface 1A.

On an inner surface of trench for gate 1a, a gate insulating film 4a, formed, for example, of a silicon oxide film having a thickness from 30 nm to 200 nm is formed. A gate electrode 5a composed of a low-resistance material (such as polycrystalline silicon in which phosphorus has been introduced at high concentration) is formed to bury the inside of trench for gate 1a.

Thus, an insulated gate structure is constituted of trench for gate 1a, gate insulating film 4a, and gate electrode 5a, on the first main surface 1A side of semiconductor substrate 1. In addition, an insulated gate field effect transistor portion (here, a MOS transistor portion) 32 having n⁻ region 1c as a drain and n-type emitter region 3 as a source is constituted of n⁻ region 1c, n-type emitter region 3, and trench for gate 1a. This MOS transistor portion 32 allows a main current to flow between first main surface 1A and second main surface 1B of semiconductor substrate 1.

A plurality of MOS transistor portions 32 are arranged in first main surface 1A, and a stabilizing plate portion 33 is formed in a region of first main surface 1A lying between two MOS transistor portions 32. This stabilizing plate portion 33 has, for example, two dummy trenches. Each of these two dummy trenches has a trench for stabilizing plate 1b, a stabilizing plate insulating film 4b, and a stabilizing plate 5b. It is noted that the number of dummy trenches formed in stabilizing plate portion 33 is not limited to two and three or more dummy trenches may be provided.

Trench for stabilizing plate 1b is formed to reach n⁻ region 1c from first main surface 1A through p-type body region 2 and n-type impurity diffusion region 14, and it has a depth, for example, from 3 μm to 10 μm from first main surface 1A of semiconductor substrate 1. A pitch ($W_{pitch}$) between trenches for stabilizing plate 1b and between adjacent trench for gate 1a and trench for stabilizing plate 1b is set, for example, to 0.5 μm to 6.0 μm.

A pitch between trenches for stabilizing plate 1b is preferably the same as a pitch between adjacent trench for gate 1a and trench for stabilizing plate 1b, in order to improve a withstand voltage. In addition, in a case where three or more dummy trenches are provided, pitches among trenches for stabilizing plate 1b are preferably equal to one another. Namely, pitches among the plurality of trenches including trench for gate 1a and trench for stabilizing plate 1b are preferably equal to one another.

Stabilizing plate insulating film 4b formed, for example, of a silicon oxide film having a thickness from 30 nm to 200 nm is formed along an inner surface of this trench for stabilizing plate 1b, as in the case of trench for gate 1a. A conductive layer composed, for example, of polycrystalline silicon in which phosphorus has been introduced at high concentration and serving as stabilizing plate 5b is formed to bury the inside of trench for stabilizing plate 1b, as in the case of trench for gate 1a.

Figure 5:
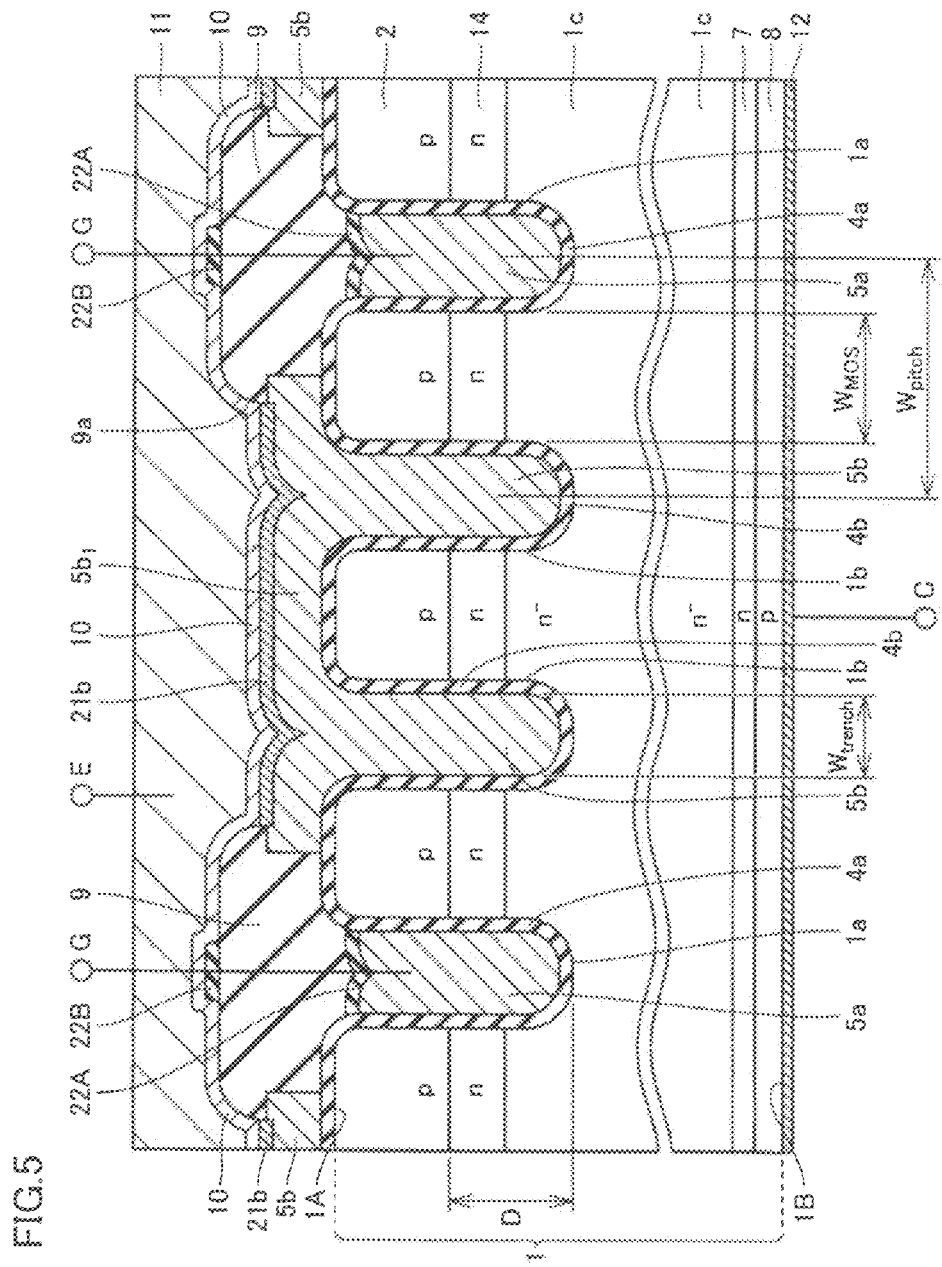
FIG. 5 is a cross-sectional view along the line V-V in FIG. 2 when viewed in a direction of an arrow.

Referring mainly to FIGS. 2 and 5, stabilizing plates 5b of two dummy trenches are electrically connected to each other through a conductive layer 5b₁. This conductive layer 5b₁ is formed on first main surface 1A of semiconductor substrate 1 with an insulating layer made of a layer the same as stabilizing plate insulating film 4b being interposed, and it is electrically isolated from semiconductor substrate 1.

Conductive layer 5b₁ is composed, for example, of polycrystalline silicon in which phosphorus has been introduced at high concentration, and formed of the same layer as stabilizing plate 5b. As shown in FIG. 2, conductive layer 5b₁ is arranged at an end portion in a longitudinal direction when trench for gate 1a and trench for stabilizing plate 1b are two-dimensionally viewed, and arranged on an end portion side relative to n-type emitter region 3 and p⁺ impurity diffusion region 6 in the longitudinal direction when viewed two-dimensionally. Namely, conductive layer 5b₁ is preferably located on the end portion side in the longitudinal direction of gate electrode 5a relative to a region Rs (a region surrounded by a chain dotted line in FIG. 2) lying between a region where n-type emitter region 3 and p⁺ impurity diffusion region 6 of one (for example, on the left in FIG. 2) MOS transistor portion 32 are formed and a region where n-type emitter region 3 and p⁺ impurity diffusion region 6 of the other (for example, on the right in FIG. 2) MOS transistor portion 32 are formed.

Referring mainly to FIGS. 3 to 5, an insulating layer 22A, an interlayer insulating film 9, and an insulating layer 22B are successively formed on first main surface 1A of semiconductor substrate 1. Insulating layer 22A is formed, for example, by subjecting gate electrode 5a or stabilizing plate 5b to thermal oxidation or CVD (Chemical Vapor Deposition) oxidation. Insulating layer 22B is selectively formed on interlayer insulating film 9. Interlayer insulating film 9 is formed with CVD (Chemical Vapor Deposition) or the like by using silicate, that is, a silicon oxide film doped, for example, with boron or phosphorus. A contact hole 9a and a contact hole 9b are formed in interlayer insulating film 9.

As shown in FIG. 5, contact hole 9a is formed to reach conductive layer 5b₁. A silicide layer 21b is formed on a surface of conductive layer 5b₁ located at a bottom portion of contact hole 9a. In addition, as shown in FIGS. 3 and 4, contact hole 9b is formed to reach n-type emitter region 3 and p⁺ impurity diffusion region 6 located in first main surface 1A. A silicide layer 21a is formed on surfaces of n-type emitter region 3, p⁺ impurity diffusion region 6, and p-type body region 2 located at the bottom portion of contact hole 9b.

Referring mainly to FIG. 2, contact hole 9a is arranged on the end portion side in the longitudinal direction when trench for gate 1a and trench for stabilizing plate 1b are two-dimensionally viewed (that is, on the end portion side in the longitudinal direction of gate electrode 5a relative to region Rs above). Contact hole 9b is not arranged in a region R lying between two trenches for stabilizing plate 1b when viewed two-dimensionally (a region surrounded by a chain double-dotted line in FIG. 2) but arranged in a region lying between trench for stabilizing plate 1b and trench for gate 1a.

As described above, region R as a whole lying between two trenches for stabilizing plate 1b is covered with insulating layer 4b, and a contact hole reaching first main surface 1A (p-type body region 2) of semiconductor substrate 1 is not formed in this region R. In a case where stabilizing plate portion 33 includes three or more dummy trenches, a region in first main surface 1A of semiconductor substrate 1 lying between trench for stabilizing plate 1b closest to one (for example, on the left in FIG. 2) MOS transistor portion 32 and trench for stabilizing plate 1b closest to the other (for example, on the right in FIG. 2) MOS transistor portion 32, among three or more trenches for stabilizing plate 1b, corresponds to region R above.

Referring mainly to FIGS. 3 to 5, a barrier metal layer 10 is formed on interlayer insulating film 9, along a side portion and the bottom portion of contact hole 9a, 9b, an upper surface of interlayer insulating film 9, and an upper surface of insulating layer 22B. In a portion of barrier metal layer 10 in contact with semiconductor substrate 1, silicide layer 21a described above is formed in order to lower contact resistance. Emitter electrode 11 is formed on first main surface 1A of semiconductor substrate 1. This emitter electrode 11 is formed on barrier metal layer 10 to be in contact therewith.

Thus, emitter electrode 11 providing an emitter potential E is electrically connected to each of two stabilizing plates 5b through contact hole 9a, and electrically connected to each of n-type emitter region 3 and p⁺ impurity diffusion region 6 through contact hole 9b. Namely, emitter electrode 11 is not connected to region R lying between two trenches for stabilizing plate 1b through a contact hole or the like, but arranged on the entire surface of that region R with at least stabilizing plate insulating film 4b being interposed.

Figure 6:
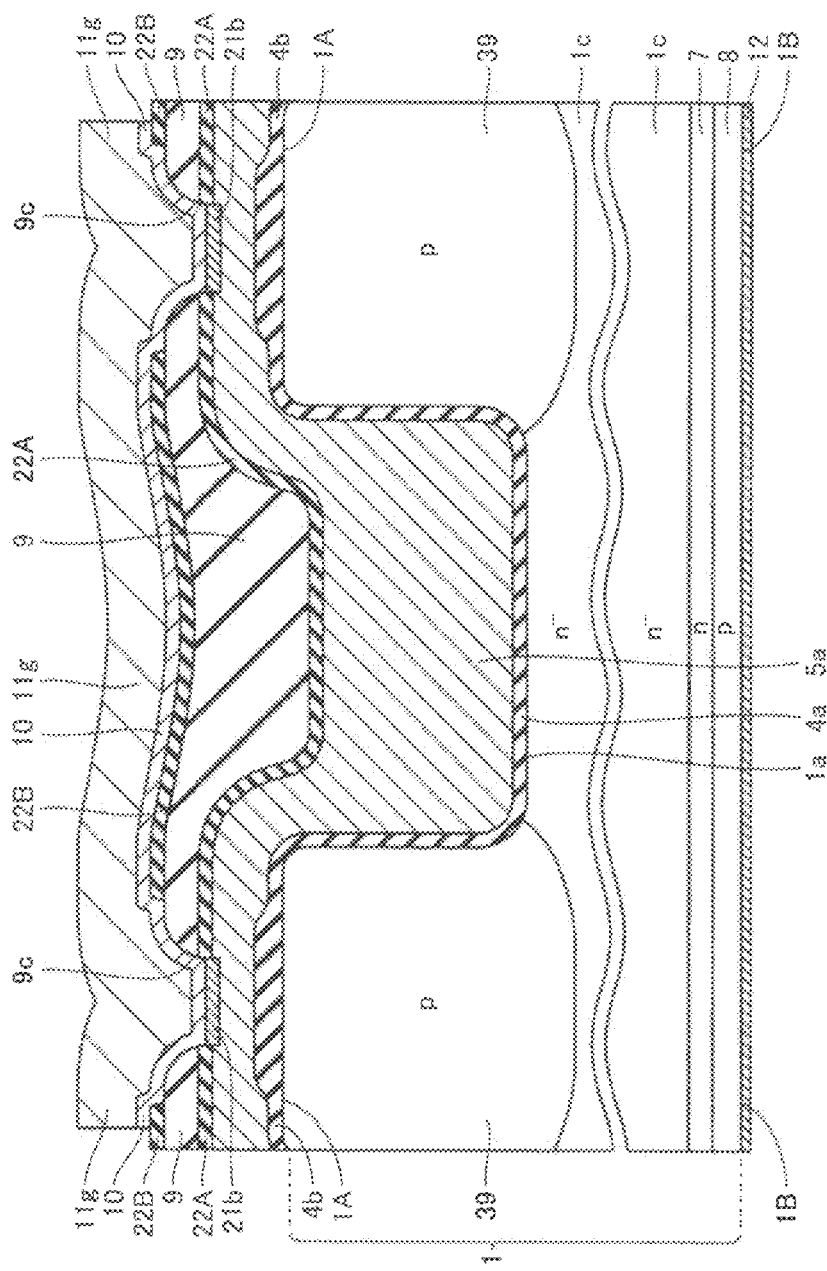
FIG. 6 is a cross-sectional view along the line VI-VI in FIG. 2 when viewed in a direction of an arrow.

Referring mainly to FIG. 6, a p-type well 39 is formed in first main surface 1A of semiconductor substrate 1 on each of opposing sides in the longitudinal direction when trench for gate 1a is viewed two-dimensionally. Gate electrode 5a extends over first main surface 1A of semiconductor substrate 1 in which this p-type well 39 is formed, with gate insulating film 4a being interposed. A contact hole 9c is formed in interlayer insulating film 9. This contact hole 9c reaches a portion of gate electrode 5a extending to p-type well 39.

Silicide layer 21b is formed on the surface of gate electrode 5a at a bottom portion of contact hole 9c. Barrier metal layer 10 is formed to extend along a side portion and the bottom portion of contact hole 9c, and a control electrode 11g providing a gate potential G is formed on this barrier metal layer 10. This control electrode 11g is a layer formed from the layer the same as emitter electrode 11, by separation by patterning. Thus, gate electrode 5a is electrically connected to control electrode 11g providing gate potential G through contact hole 9c, at the end portion in the longitudinal direction thereof.

Referring mainly to FIGS. 3 to 6, an n-type buffer region 7 and a p-type collector region 8 are successively formed on the second main surface 1B side of n⁻ region 1c. A collector electrode 12 providing a collector potential C is electrically connected to this p-type collector region 8. For example, an aluminum compound is employed for a material for this collector electrode 12.

A mesa width ($W_{MOS}$), a trench pitch ($W_{pitch}$), and a trench width ($W_{trench}$) in the semiconductor device in the present embodiment will now be described with reference to FIGS. 2 to 5.

Emitter electrode 11 is electrically connected to conductive layer $5b_1$ on the end portion side in the longitudinal direction of gate electrode 5a relative to region Rs above, in the two-dimensional view shown in FIG. 2. Since stabilizing plate 5b is formed from a low-resistance material, stabilizing plate 5b as a whole is set to an emitter potential. The reason why stabilizing plate 5b is set to the emitter potential is to decrease a gate capacitance, to suppress oscillation at the time of short-circuiting of the IGBT, and to prevent device breakdown. Emitter electrode 11 is electrically connected to stabilizing plate 5b on the end portion side in the longitudinal direction of gate electrode 5a relative to region Rs above, for the following reasons. Namely, if conductive layer $5b_1$ is arranged in region Rs above when an ON voltage is lowered by decreasing a mesa width ($W_{MOS}$) and/or a trench pitch ($W_{pitch}$), a region for connecting emitter electrode 11 to n-type emitter region 3 or p-type impurity diffusion region 6 becomes narrow and reliable electrical connection between emitter electrode 11 and n-type emitter region 3 or p-type impurity diffusion region 6 may become difficult as will be described later with reference to FIGS. 22 and 24.

In the present embodiment, a mesa width ($W_{MOS}$) represents a distance between trench for gate 1a and trench for stabilizing plate 1b and between trenches for stabilizing plate 1b. A mesa width between trench for gate 1a and trench for stabilizing plate 1b and a mesa width between trenches for stabilizing plate 1b are provided to be equal to each other. In addition, a trench pitch ($W_{pitch}$) represents an arrangement pitch between trench for gate 1a and trench for stabilizing plate 1b and an arrangement pitch between trenches for stabilizing plate 1b. A trench pitch between trench for gate 1a and trench for stabilizing plate 1b and a trench pitch between trenches for stabilizing plate 1b are provided to be equal in distance to each other. Moreover, a trench electrode width ($W_{trench}$) represents a width of each of gate electrode 5a and stabilizing plate 5b. A trench electrode width of gate electrode 5a and a trench electrode width of stabilizing plate 5b are provided to be equal to each other.

The trench gate type IGBT in the present embodiment is formed such that relation between a mesa width ($W_{MOS}$), a trench pitch ($W_{pitch}$) and a trench width ($W_{trench}$) satisfies $W_{MOS}=W_{pitch}-W_{trench}>0$ (Equation 1).

A function and effect of the semiconductor device in the present embodiment will now be described in comparison with the conventional examples.

Figure 7:
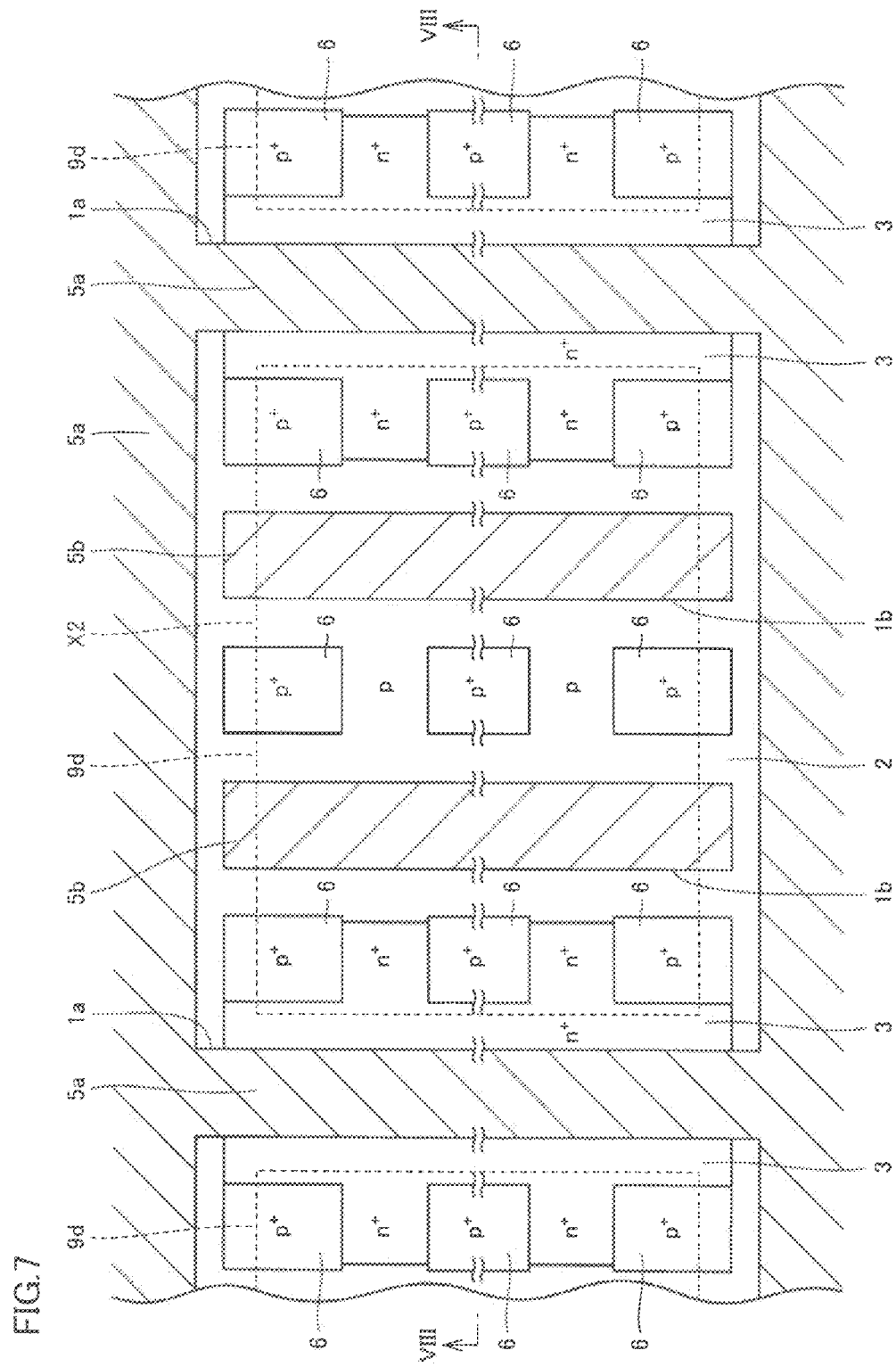
FIG. 7 is a partial plan view schematically showing a construction of a semiconductor device in a comparative example.
Figure 8:
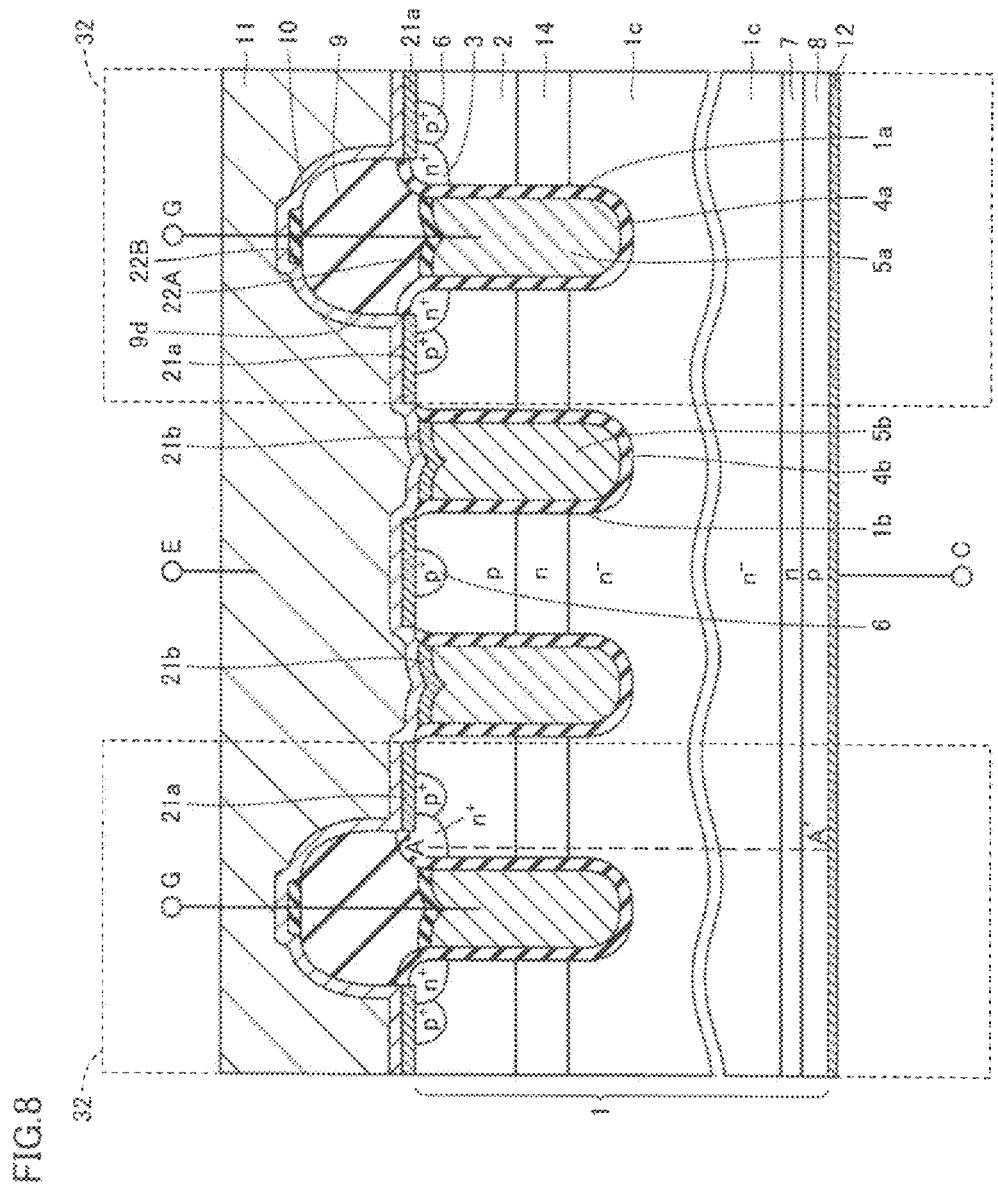
FIG. 8 is a cross-sectional view along the line VIII-VIII in FIG. 7 when viewed in a direction of an arrow.

FIGS. 7 and 8 each show a structure of a conventional trench gate type IGBT. A region X2 in FIG. 7 shows a two-dimensional shape of a contact hole 9d formed in interlayer insulating film 9 in the conventional trench gate type IGBT. Emitter electrode 11 is electrically connected to n-type emitter region 3, p⁺ impurity diffusion region 6, p-type body region 2, and stabilizing plate 5b through this contact hole 9d. Namely, emitter electrode 11 is electrically connected also to p-type body region 2 and p⁺ impurity diffusion region 6 present in first main surface 1A of semiconductor substrate 1 lying between stabilizing plates 5b.

In addition, p⁺ impurity diffusion region 6 is formed also in first main surface 1A of semiconductor substrate 1 lying between two stabilizing plates 5b. Moreover, n-type emitter region 3 is formed between gate electrode 5a and p⁺ impurity diffusion region 6 along the longitudinal direction of gate electrode 5a.

Further, when viewed from above, trench for gate 1a and trench for stabilizing plate 1b are identical in pattern to gate electrode 5a and stabilizing plate 5b shown in FIG. 1 or 4, respectively.

It is noted that the conventional examples are otherwise substantially the same in construction as the present embodiment and therefore the same components have the same reference characters allotted and description thereof will not be repeated.

In a conventional structure, emitter electrode 11 is electrically connected also to p-type body region 2 and p+ impurity diffusion region 6 present in the first main surface of semiconductor substrate 1 lying between stabilizing plates 5b. Therefore, it was found in the studies of the examples which will be described later that carrier concentration while a trench MOS transistor portion is in the ON state becomes lower and the ON resistance becomes higher.

In contrast, as shown in FIG. 2, in the structure in the present embodiment, emitter electrode 11 is not electrically connected to p-type body region 2 in region R lying between stabilizing plates 5b when viewed two-dimensionally. Emitter electrode 11 is merely electrically connected to a region lying between stabilizing plate 5b and gate electrode 5a through contact hole 9b and electrically connected to conductive layer $5b_1$ located outside region Rs. Namely, as shown in FIGS. 3 to 5, emitter electrode 11 is not electrically connected to first main surface 1A of semiconductor substrate 1 in stabilizing plate portion 33 but is electrically connected to first main surface 1A of semiconductor substrate 1 in MOS transistor portion 32. Therefore, it was found in the studies of the examples which will be described later that, during the ON state, little current flows in stabilizing plate portion 33 but flows in MOS transistor portion 32 in a concentrated manner and hence an ON voltage is lower than in the conventional examples.

In addition, it was found that an effect to lower the ON voltage above is enhanced in the construction of the present embodiment as a ratio of trench for stabilizing plate 1b in stabilizing plate portion 33 occupied in a unit cell increases, and hence the ON voltage can further be lowered. The construction in the present embodiment is such a structure that a ratio of trench for stabilizing plate 1b occupied in a unit cell can readily be increased owing to absence of p+ impurity diffusion region 6 in region R lying between trenches for stabilizing plate 5b and devised arrangement of conductive layer $5b_1$. Moreover, by increasing a ratio of this trench for stabilizing plate 1b, decrease in effective gate width W ($W_1+ \ldots +W_n$ in FIG. 2) is also facilitated. Therefore, lowering in saturation current is also facilitated and improvement in short-circuit capability is facilitated, which will be described below.

As can be seen from Equation 2 below representing a drain current $I_D$ (saturation current) in a saturated region of a MOS transistor, as effective gate width W decreases, drain current $I_D$ of the MOS transistor decreases. In the present embodiment, by increasing a ratio of the number of trenches for stabilizing plate 1b not serving as gate interconnection, effective gate width W ($W_1+ \ldots +W_n$ in FIG. 2) occupied in an effective cell size of MOS transistor portion 32 is decreased. Thus, a short-circuit current of the IGBT is suppressed and short-circuit capability is improved. As will be described further later, by increasing a ratio of the number of trenches for stabilizing plate 1b, the ON voltage can also further be lowered and therefore short-circuit capability can be improved or maintained and the ON voltage can be lowered.

$$I_D = \frac{1}{2} \cdot \frac{W}{L} \cdot \mu \cdot C_{ox}(V_G - V_{th})^2 \quad \text{(Equation 2)}$$

In Equation 2 above, $I_D$ represents a drain current (saturation current) in a saturated region, W represents an effective gate width, μ represents mobility, $C_{OX}$ represents a gate insulating film capacity per unit area, $V_G$ represents a gate voltage, and $V_{th}$ represents a threshold voltage. L represents a channel length, and in the semiconductor device of the present embodiment, it corresponds to a distance along trench for gate 1a from a lower end of n-type emitter region 3 to a boundary surface between p-type body region 2 and n-type impurity diffusion region 14.

A current that flows through a device when a load is short-circuited is determined by a saturation current of the device. When a saturation current is low, a current that flows at the time of short-circuiting is also low and energy load imposed on the device also decreases. Therefore, short-circuit capability can be improved by suppressing a saturation current.

Figure 9:
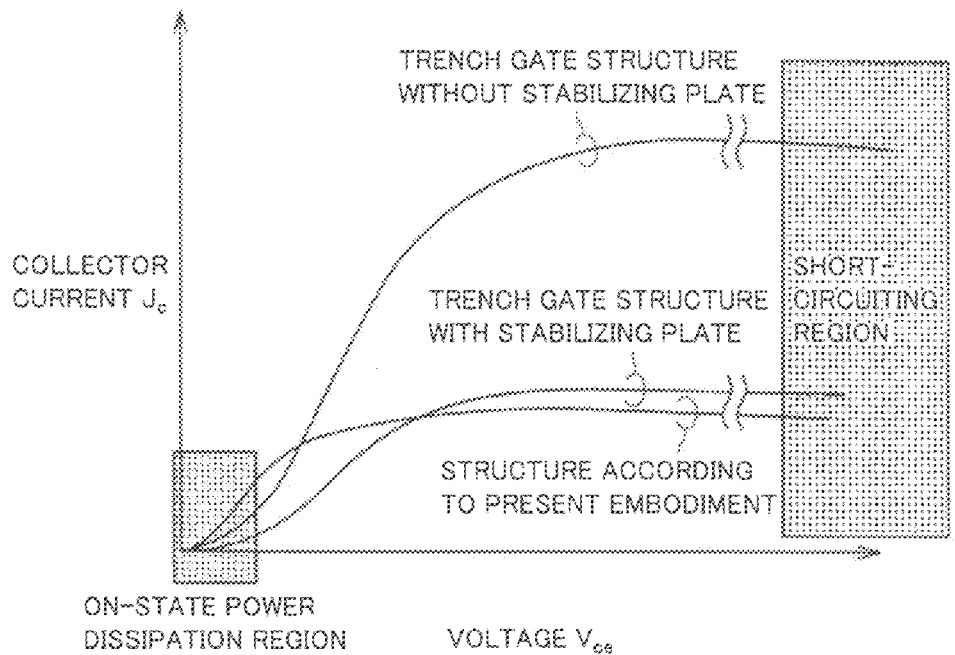
FIG. 9 is a diagram showing relation between a saturation current and an ON voltage.

In addition, in the structure in the present embodiment, since emitter electrode 11 is not connected to p-type body region 2 in a region lying between stabilizing plates 5b, a current can be concentrated in MOS transistor portion 32. Further, since the number of trenches for stabilizing plate 1b can readily be increased, an effect to lower the ON voltage is also obtained (an ON voltage Vce with respect to the same collector current Jc in an ON-state power dissipation region shown in FIG. 9 decreases). Namely, by employing the present structure, ON-state power dissipation can be decreased while short-circuit capability is maintained.

Furthermore, since MOS transistor portion 32 is readily reduced in size, an effective gate width can be decreased by reducing the size of MOS transistor portion 32, a saturation current is lowered, and short-circuit capability is readily improved. Therefore, yield of semiconductor devices can be improved.

In addition, in the conventional examples described above, in order to lower contact resistance between p-type body region 2 and emitter electrode 11, p+ impurity diffusion region 6 is provided between adjacent stabilizing plates 5b. A portion where this p+ impurity diffusion region 6 is provided serves as a path through which holes escape when the IGBT is turned off, and turn-off disconnection capability of the IGBT, that is, current density and a voltage that can be turned off, are lowered.

In contrast, according to the construction of the present embodiment, emitter electrode 11 is not connected to p-type body region 2 lying between stabilizing plates 5b through a contact hole as described above. Therefore, in addition to lowering in an ON voltage, a path through which holes escape is not produced in a region lying between stabilizing plates 5b when the IGBT is turned off, and current density and a voltage that can be turned off can be prevented from lowering.

Moreover, as shown in FIG. 2, in the structure in the present embodiment, emitter electrode 11 is not electrically connected to p-type body region 2 in region R lying between stabilizing plates 5b when viewed two-dimensionally. Therefore, as in the construction shown in FIGS. 23 and 24, it is not necessary to ensure a large mesa width between trench for gate 1a and trench for stabilizing plate 1b in consideration of connection between emitter electrode 11 and n-type emitter region 3 or p+ impurity diffusion region 6. Thus, in the present embodiment, a mesa width between trench for gate 1a and trench for stabilizing plate 1b can be made smaller and a degree of freedom in designing this mesa width is improved. In addition, since a mesa width can be made smaller, an ON voltage can also further be lowered.

When trench pitches above are different in each portion, distribution of electric field around each trench 1a, 1b becomes non-uniform, electric field concentration is caused, and a withstand voltage is lowered. Therefore, in the present embodiment, a trench pitch between trench for gate 1a and trench for stabilizing plate 1b and a trench pitch between trenches for stabilizing plate 1b are provided to be equal to each other. Thus, electric field concentration around a trench is prevented and a withstand voltage can be improved. Namely, since a mesa width between trench for gate 1a and trench for stabilizing plate 1b can be made smaller in the above, a trench pitch between trench for gate 1a and trench for stabilizing plate 1b can accordingly be made smaller. Further, by decreasing also a trench pitch between trenches for stabilizing plate 1b in accordance with decrease in trench pitch between trench for gate 1a and trench for stabilizing plate 1b, a device can also be reduced in size while lowering in withstand voltage due to concentration of electric field is prevented.

Examples

A specific example of the trench gate type IGBT having the construction above will be described below.

Simulation parameters of the trench gate IGBT are as shown in Table 1 below. A dummy trench ratio used in present data is as shown in Table 2. The dummy trench ratio is defined as a value calculated by dividing the number of dummy trenches (trenches for stabilizing plate) per one cell (a unit cell portion 34) by the total number of trenches (the number of trenches for gate+the number of dummy trenches) per one cell (unit cell portion 34), that is, the number of stabilizing plates/the total number of trenches.

TABLE 1

| Region | Impurity Concentration |
| --- | --- |
| n⁻ Region 1c | $1.313 \times 10^{13}$ cm$^{-3}$ |
| p-type Body Region 2 | $9.45 \times 10^{17}$ cm$^{-3}$ |
| n-type Emitter Region 3 | $20 \times 10^{19}$ cm$^{-3}$ |
| Trench Oxide Film (Gate Insulating Film 4a, Emitter Insulating Film 4b) | 0.12 μm |
| p⁺ Impurity Diffusion Region 6 | $5.71 \times 10^{19}$ cm$^{-3}$ |
| n-type Buffer Region 7 | $30 \times 10^{16}$ cm$^{-3}$ |
| p-type Collector Region 8 | $1 \times 10^{18}$ cm$^{-3}$ |
| n-type Impurity Diffusion Region 14 | $6.5 \times 10^{16}$ cm$^{-3}$ |

TABLE 2

| Dummy Trench Ratio | The Number of Stabilizing Plates/ The Total Number of Trenches |
| --- | --- |
| 0.5 | 1/2 |
| 0.67 | 2/3 |
| 0.75 | 3/4 |
| 0.8 | 4/5 |
| 0.875 | 7/8 |
| 0.9 | 9/10 |
| 0.92 | 11/12 |
| 0.93 | 13/14 |

It is noted that, in the present embodiment, not an absolute value of the number of trenches for gate 1a and the number of trenches for stabilizing plate 1b but a ratio therebetween is important. Namely, regardless of the number of trenches for gate 1a and trenches for stabilizing plate 1b, characteristics of a device are greatly dependent on a dummy trench ratio.

(i) Mesa Width ($W_{MOS}$)

Figure 10:
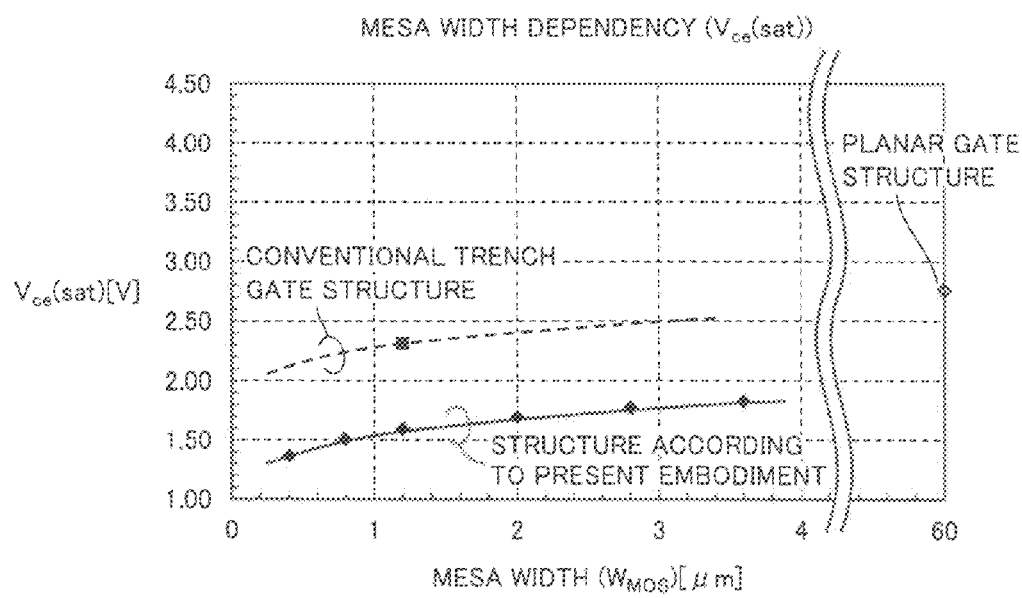
FIG. 10 is a diagram showing mesa width dependency of an ON voltage lowering effect.

By narrowing a mesa width ($W_{MOS}$) between trench electrodes (between trench for gate 1a and trench for stabilizing plate 1b and between trench for stabilizing plate 1b and trench for stabilizing plate 1b), an effect to decrease an ON voltage and ON-state power dissipation can be obtained. FIG. 10 shows that relation.

FIG. 10 shows a mesa with ($W_{MOS}$) [μm] on the abscissa and an ON voltage (Vce(sat)) [V] on the ordinate. In FIG. 10, a trench width ($W_{trench}$) is assumed as constant. For reference purposes, data of a conventional planar gate structure IGBT shown in FIG. 28 is plotted in FIG. 10, with parameters (a unit cell dimension) being the same. Referring to FIG. 28, in the planar gate structure, gate electrode 5a is located on first main surface 1A of semiconductor substrate 1 and formed on p-type body region 2 lying between n-type emitter region 3 and n-type impurity diffusion region 14, with gate insulating film 4a being interposed. Emitter electrode 11 is electrically connected to n-type emitter region 3 and p⁺ impurity diffusion region 6. It is noted that the planar gate structure IGBT is otherwise substantially the same in construction as MOS transistor portion 32 of the trench gate structure shown in FIG. 2, and therefore the same components have the same reference characters allotted and description thereof will not be repeated.

Though the data shown in FIG. 10 representatively shows data at 298 K (25° C.), similar tendency is exhibited at other temperatures. In addition, a ratio between the gate electrode of the trench electrode and the stabilizing plate per one cell results from simulation at a dummy trench ratio of 0.875 between a single gate electrode and seven stabilizing plates.

In the structure in the present embodiment, emitter electrode 11 is not connected to p-type body region 2 in stabilizing plate portion 33 through a contact hole and hence carrier concentration in MOS transistor portion 32 can be raised. Therefore, an ON voltage can be lower than in the conventional examples shown in FIGS. 7 and 8. It can be seen that a mesa width ($W_{MOS}$) can be narrowed and carrier density in MOS transistor portion 32 can further be increased with the use of the structure in the present embodiment, and hence an ON voltage can further be lower than in the conventional examples.

In addition, the conventional trench structure (see FIGS. 7 and 8) also exhibits similar tendency with regard to relation between a mesa width ($W_{MOS}$) and an ON voltage lowering effect. As described previously, however, since contact between emitter electrode 11 and p-type body region 2 is established by the entire surface of the region of stabilizing plate 5b in the conventional structure, carrier concentration during the ON state of the trench MOS transistor portion is lowered and the ON resistance becomes high.

In contrast, in the structure in the present embodiment, emitter electrode 11 is not connected to p-type body region 2 in stabilizing plate portion 33 through a contact hole. Therefore, carrier concentration during the ON state in trench MOS transistor portion 32 increases and a high effect to lower the ON voltage can be obtained.

(ii) Dummy Trench Ratio

Figure 11:
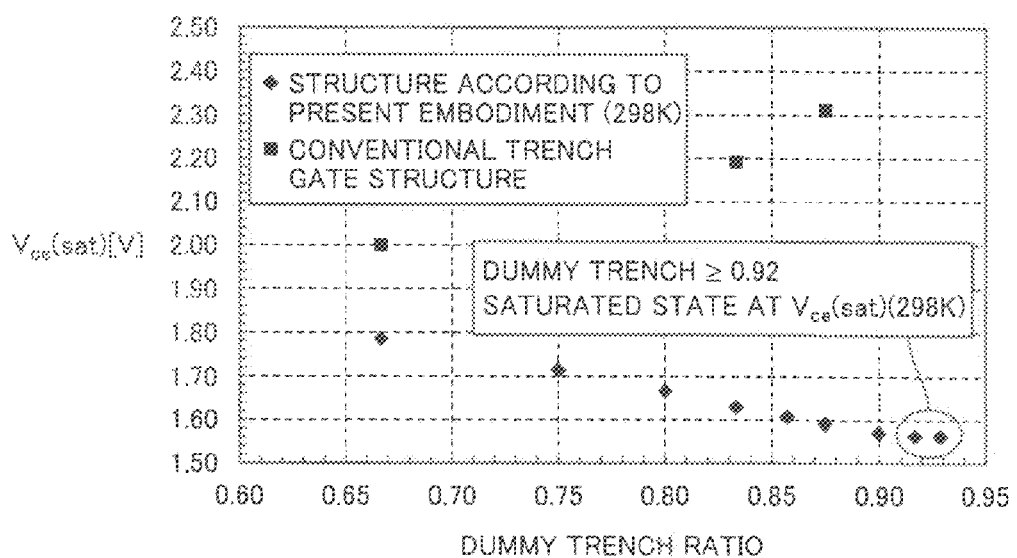
FIG. 11 is a diagram showing relation between a ratio of a trench for stabilizing plate and an ON voltage.

By increasing a ratio of stabilizing plate 5b with respect to gate electrode 5a (increasing the dummy trench ratio) in the structure in the present embodiment, lowering in the ON voltage and an effect to decrease ON-state power dissipation can be obtained. FIG. 11 shows this relation. The abscissa represents a dummy trench ratio and the ordinate represents an ON voltage (Vce(sat)). Since energy loss in a device is represented as (current that flows in a device)×(a voltage applied to the device), ON-state power dissipation decreases as the ON voltage lowers.

Figure 12B:
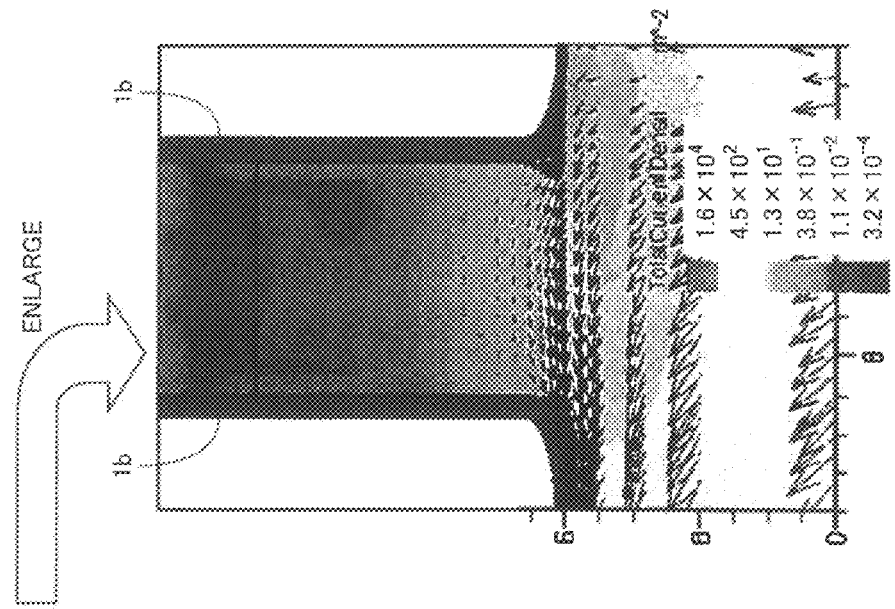
FIGS. 12A and 12B are diagrams showing current density and a current path in an element of the semiconductor device in the first embodiment of the present invention, respectively.
Figure 12A:
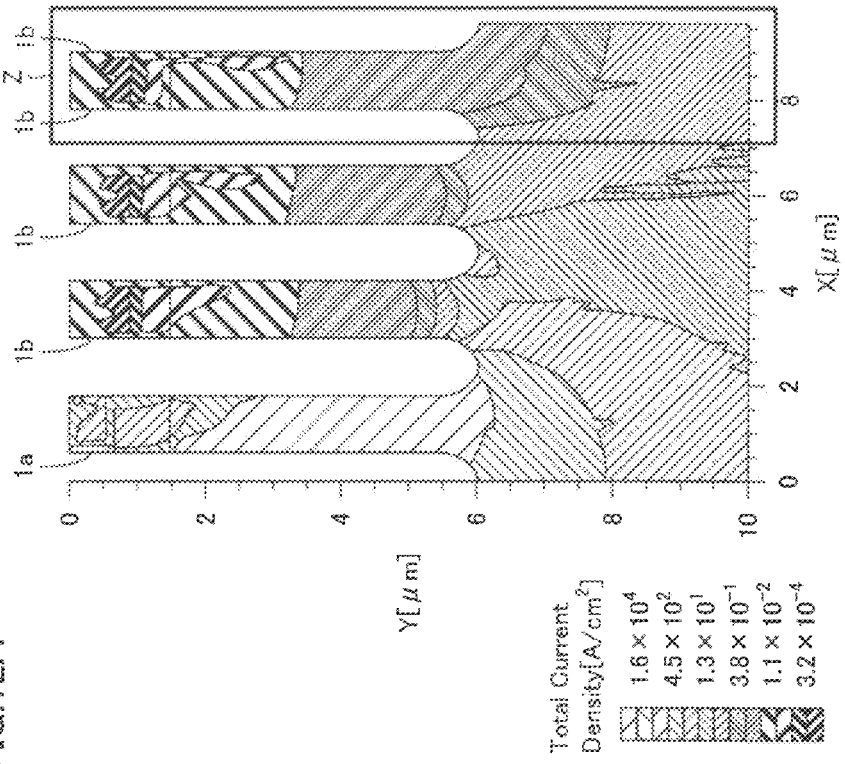
Figure 13B:
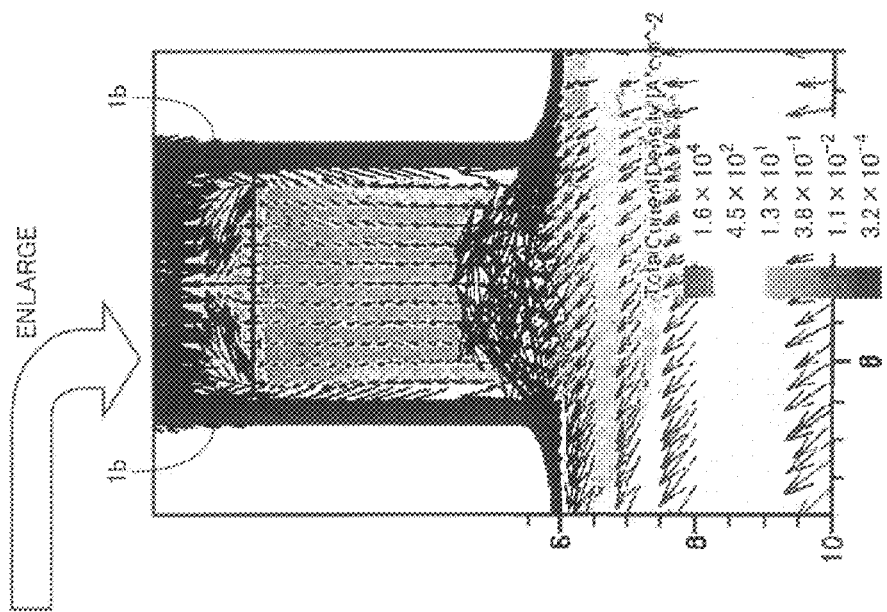
FIGS. 13A and 13B are diagrams showing current density and a current path in an element of the semiconductor device in the comparative example, respectively.
Figure 13A:
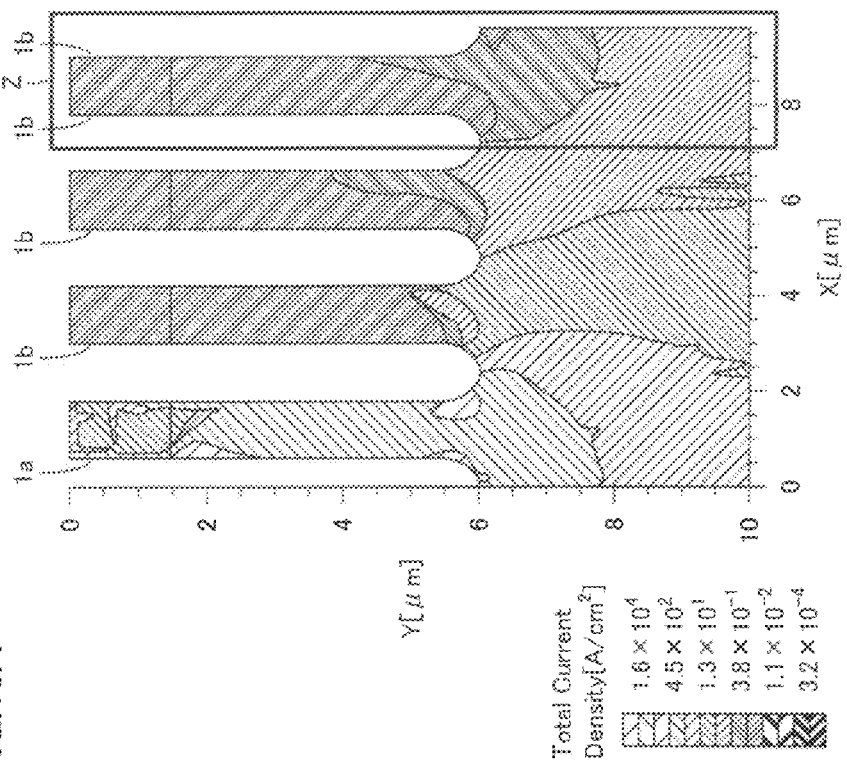

FIGS. 12A, 12B, 13A, 13B, and 14 show the principles of lowering in this ON voltage. FIGS. 12A and 13A each show current density in a device when the IGBT is in the ON state, FIGS. 12B and 13B each show a current path in a region lying between the stabilizing plates when the IGBT is in the ON state, and FIG. 14 shows carrier concentration in the device in the ON state. It is noted that FIGS. 12A and 12B show the case of the structure in the present embodiment while FIGS. 13A and 13B show the case of the conventional trench electrode structure shown in FIGS. 7 and 8, which correspond to the cross-sections shown in FIGS. 3 and 8, respectively.

In each of FIGS. 12A and 13A, the left end (X=0 μm) indicates trench for gate 1a, and trenches for stabilizing plate 1b are aligned at prescribed pitches (X>0). In addition, FIGS. 12B and 13B are enlarged views of regions surrounded by Z in FIGS. 12A and 13A respectively, a direction of an arrow in FIGS. 12B and 13B shows a direction of flow of a current, and a length of the arrow shows magnitude of current density.

During the ON state of the structure in the present embodiment (FIG. 2) shown in FIGS. 12A and 12B, a voltage bias (a positive bias applied to the gate because the present structure is an n channel MOS transistor) is applied to the gate electrode of trench MOS transistor portion 32 located lateral to stabilizing plate portion 33, and electrons are injected into n⁻ region 1c through a channel portion (a portion in contact with trench for gate 1a in p-type body region 2). Here, since the collector side is forward-biased, holes are simultaneously injected into n⁻ region 1c from the collector side.

Here, in the structure of the present embodiment, emitter electrode 11 is not connected to p-type body region 2 in stabilizing plate portion 33, that is, between adjacent trenches for stabilizing plate 1b, but connected to p-type body region 2 through contact hole 9b in MOS transistor portion 32, that is, between trench for gate 1a and trench for stabilizing plate 1b. Therefore, since a path through which holes flow to the emitter side is formed by trench MOS transistor portion 32 alone in the present structure, little current flows in stabilizing plate portion 33 and a current flows in trench MOS transistor portion 32 in a concentrated manner.

Since a current concentrates in trench MOS transistor portion 32, carrier concentration during the ON state of trench MOS transistor portion 32 increases and the ON voltage is lowered. As shown in FIG. 11, as a ratio of dummy trenches occupied in a unit cell increases, this effect is enhanced (that is, carrier concentration during the ON state of trench MOS transistor portion 32 further increases), the ON voltage is further lowered, and ON-state power dissipation is decreased.

In contrast, as shown in FIGS. 13A and 13B, since emitter electrode 11 is connected also to p-type body region 2 between stabilizing plates 5b in the conventional trench electrode structure, a current also flows between stabilizing plates 5b and current concentration in trench MOS transistor portion 32 is less likely.

Namely, in the conventional structure, a path for holes is formed also between dummy trenches, because there is a connection portion in stabilizing plate portion 33 through which holes escape. Consequently, difference in degree of concentration of current as shown in FIGS. 12B and 13B is caused, and influence thereby changes carrier concentration distribution on the emitter side of trench MOS transistor portion 32 between the present embodiment and the conventional example as shown in FIG. 14 and difference in ON voltage Vce(sat) is caused.

FIG. 14 is a graph for comparing carrier concentration distribution while the IGBT in trench MOS transistor portion 32 is in the ON state between the semiconductor devices in the present embodiment shown in FIGS. 2 to 6 and the conventional example shown in FIGS. 7 and 8. Carrier density distribution shown in FIG. 14 corresponds to the A-A' portion in FIGS. 3 and 8 and the B-B' portion in FIG. 28.

FIGS. 14 and 15 each show relation between this device structure and current concentration. FIGS. 14 and 15 each represent a distance from the emitter region to the collector region on the abscissa and carrier concentration on the ordinate. FIG. 15 is an enlarged view of the emitter side in FIG. 14. In addition, the present data corresponds to the A-A' portion in FIGS. 3 and 8 and the B-B' portion in FIG. 28 and includes a portion where a channel is formed.

It is noted that FIG. 14 shows comparison between cases where a dummy trench ratio of each semiconductor device is the same (except for a planar gate structure). In the structure of the present embodiment shown in FIGS. 2 to 6, a current path is formed only by trench MOS transistor portion 32 adjacent to trench for gate 1a, and consequently carrier concentration on the emitter side during the ON state increases as shown in FIG. 14. To the contrary, as emitter electrode 11 is connected to p-type body region 2 in the stabilizing plate portion as in the structure of the conventional example shown in FIGS. 7 and 8, a current path is produced also in p-type body region 2 and p⁺ impurity diffusion region 6 between adjacent trenches for stabilizing plate 1b. Thus, since a current path is formed also in a portion other than the trench MOS transistor portion, carrier concentration during the ON state of the trench MOS transistor portion is lowered. Therefore, the conventional semiconductor device is higher in ON voltage than the present embodiment.

Referring to FIGS. 14 and 15, in the trench electrode structure in the present embodiment, holes injected from the collector region side reach the emitter side without lowering in density within n⁻ region (n⁻ drift region) 1c. In addition, by increasing stabilizing plates 5b, concentration of carrier occurs on the emitter side and carrier concentration on the emitter side within n⁻ region (n⁻ drift region) 1c increases. In contrast, in both of the conventional trench electrode structure and the planar gate structure, carrier concentration lowers toward the emitter side.

Namely, in the trench electrode structure in the present embodiment, as a result of a carrier concentration increasing effect from the n⁻ drift region toward the emitter side, an ON voltage lowering effect can be obtained as the dummy trench ratio increases. It is noted that a carrier concentration effect is saturated when the dummy trench ratio exceeds 0.92 (see FIG. 11).

When the present embodiments are compared with each other, carrier concentration is higher in a case where the dummy trench ratio is set to 0.875 than in a case where it is set to 0.67. While the IGBT is in the ON state, holes travel directly under stabilizing plate portion 33 to trench MOS transistor portion 32. As a distance of travel is greater, hole concentration directly under stabilizing plate portion 33 increases. Consequently, carrier concentration in trench MOS transistor portion 32, which is an only path for holes, becomes high, because carriers are concentrated as the length of stabilizing plate portion 33 is greater (the dummy trench ratio increases). As carrier concentration is higher, carrier concentration in that portion increases and a resistance is lowered, and hence an ON voltage is lowered.

As shown in FIGS. 14 and 15, density of holes is substantially equal to density of electrons, except for the emitter region. In addition, as shown in FIG. 15, in the emitter region, electron density is higher than hole density.

It is noted that lowering in carrier concentration toward the emitter in the conventional trench gate structure or planar gate structure is due to lowering in electron supply capability (injection capability).

From the foregoing, a dummy trench ratio capable of achieving an ON voltage lowering effect owing to stabilizing plate 5b is preferably in a range from 0.5, with the number of stabilizing plates being minimized, to 0.92, at which a carrier concentration effect is saturated (that is, in a range not lower than 0.5 and not higher than 0.92).

Figure 16:
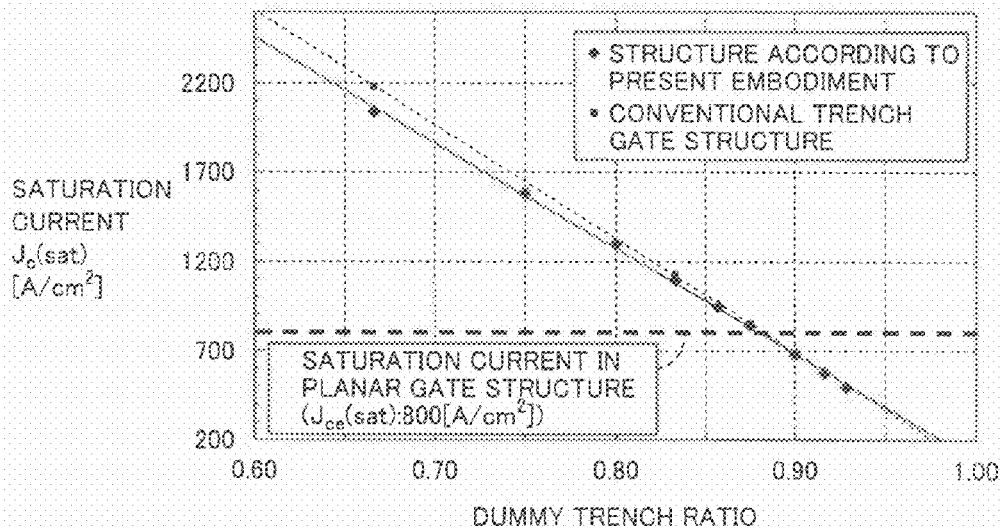
FIG. 16 is a diagram showing relation between a ratio of a trench for stabilizing plate and a saturation current.

Referring also to FIG. 16, as can also be seen from the diagram showing relation between a dummy trench ratio and a saturation current, by increasing stabilizing plates 5b, a gate width is made smaller and a saturation current can be suppressed.

A region where trench MOS transistor portion 32 and stabilizing plate portion 33 are integrated (unit cell portion 34 shown in FIGS. 3 and 4) serves as a cell unit in the trench gate structure in the present embodiment. In addition, as the dummy trench ratio increases, a total gate width W occupied in unit cell portion 34 becomes smaller.

According to the structure of the present embodiment, an IGBT capable of maintaining short-circuit capability and achieving a lower ON voltage by suppressing a saturation current can be realized. In the structure of the present embodiment, however, since any dummy trench ratio can be set, both of suppression of a saturation current and a lower ON voltage can be achieved (see FIGS. 11 and 16).

Figure 17:
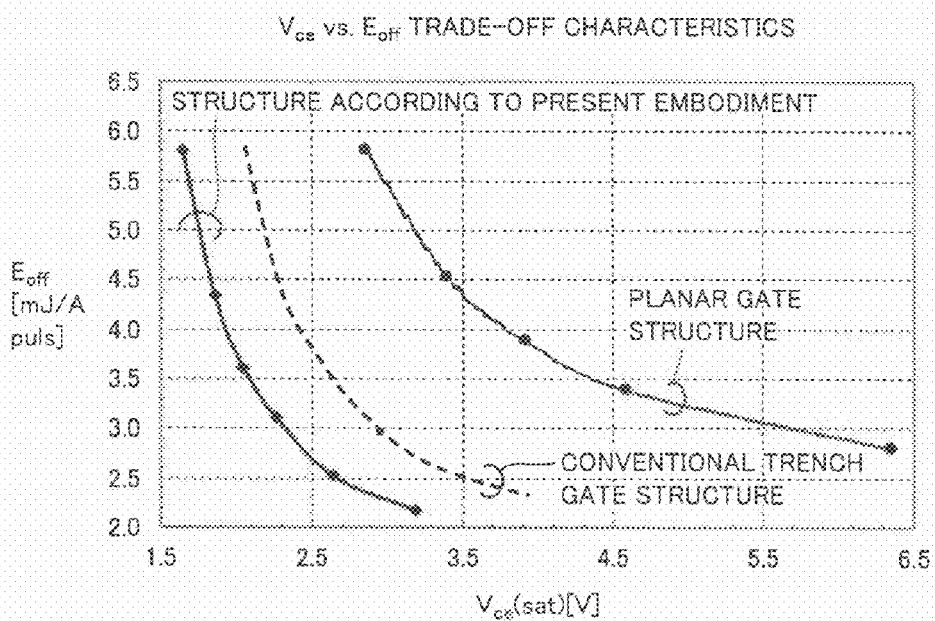
FIG. 17 is a diagram showing relation between an ON voltage Vce(sat) and switching loss Eoff.

FIG. 17 shows relation between an ON voltage (Vcc(sat)) and switching loss (Eoff). Relation is such that ON-state power dissipation decreases as the ON voltage is lower. Data points shown in connection with the present embodiment are plotted to correspond to impurity concentrations (collector concentrations) in p-type collector region 8 from $1 \times 10^{16}$ to $5 \times 10^{20}$, and as collector concentration is higher, the ON voltage is lower.

The reason why the ON voltage and the switching loss satisfy trade-off relation will be described. In the IGBT, two device characteristics of the ON voltage and the switching loss are controlled by a common control parameter other than the device structure, In the present embodiment, for example, the parameter is represented by the collector concentration.

In a case where ON-state power dissipation is decreased by lowering the ON voltage, collector concentration is increased in order to increase carrier concentration on the collector side. Then, holes at high concentration are injected from the collector side into $n^-$ region 1c while the IGBT is in the ON state, and a time period for discharging injected holes is required when the IGBT is turned off, and thus switching loss increases. In decreasing switching loss to the contrary, collector concentration is lowered, however, the ON voltage becomes higher. As set forth above, the ON voltage and the switching loss satisfy trade-off relation.

In the present embodiment, however, even though carrier concentration on the collector side is the same, the ON voltage (Vce(sat)) can be lower than in the semiconductor device having the conventional structure. Therefore, a trade-off curve shown in FIG. 17 can be moved toward a low ON-voltage side and trade-off characteristics can be improved.

Therefore, according to the trench electrode structure in the present embodiment, ON-state power dissipation can be decreased and hence total loss (switching loss+ON-state power dissipation) can also be decreased.

It is noted that the data shown in FIGS. 11 to 17 is data under such simulated conditions as a thickness tsub of semiconductor substrate 1 being set to 470 µm, a mesa width ($W_{MOS}$) being set to 1.2 µm, and a trench width ($W_{trench}$) being set to 1.2 µm. In addition, though data at 298 K (25° C.) is representatively shown, similar tendency is exhibited at other temperatures.

Regarding relation with the dummy trench ratio described so far, similar effects can be obtained regardless of presence/absence of n-type emitter region 3 (a portion different between FIGS. 3 and 4).

(iii) Trench Depth (D)

Figure 18:
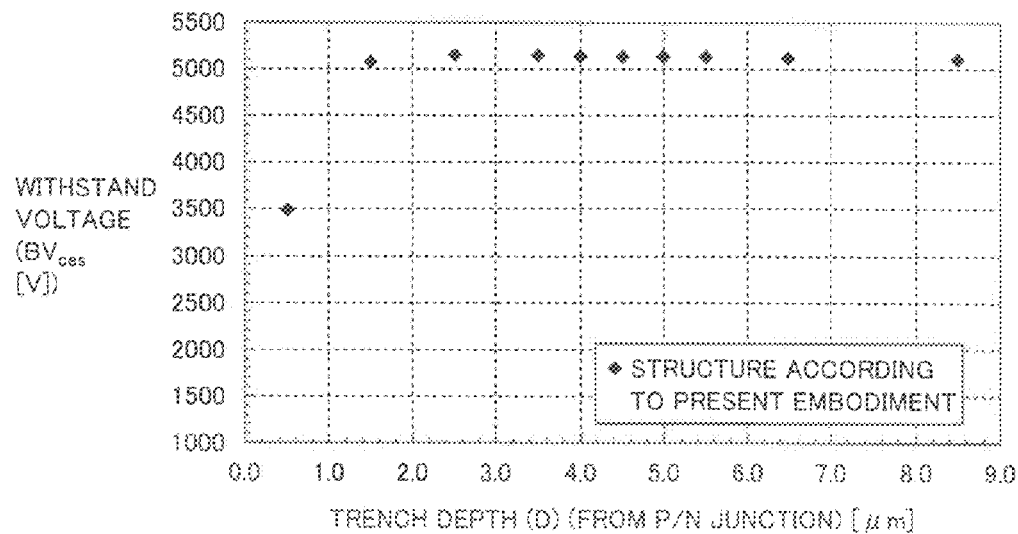
FIG. 18 is a diagram showing relation between a trench depth from a P/N junction and a withstand voltage.
Figure 19:
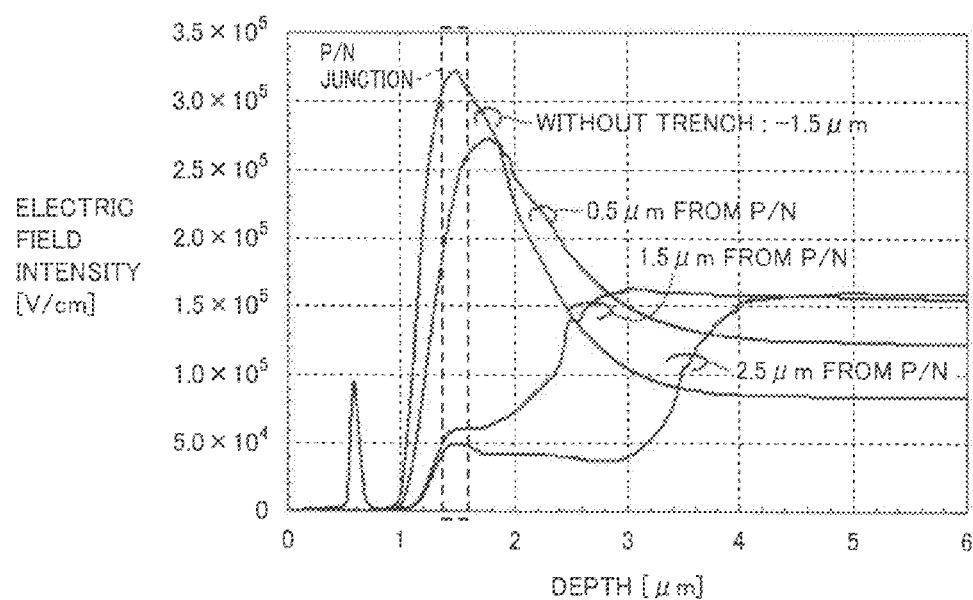
FIG. 19 is a diagram showing electric field intensity distribution in a direction of depth.

FIG. 18 shows relation between a trench depth (D: a depth from a P/N junction on the emitter side formed by p-type body region 2 and n-type impurity diffusion region 14; see FIG. 3) and a withstand voltage, and FIG. 19 shows relation between a depth from the first main surface of the semiconductor substrate and electric field intensity at various trench depths (D). In FIG. 18, by designing a trench depth (D) at least to a depth capable of mitigating electric field concentration caused between P/N junctions on the emitter side in the trench electrode structure in the present embodiment, a sufficient withstand voltage can be obtained. As shown in FIG. 19, a trench depth (D) capable of mitigating electric field concentration at the P/N junction on the emitter side is not smaller than 1.5 µm from the P/N junction.

A mechanism with which electric field concentration is mitigated as a trench depth is greater will be described. When the IGBT retains a withstand voltage, trench portions of a gate and a stabilizing plate are set to 0 V which is as high as a source potential. Consequently, these trench portions induce charges as in a field plate, pushes an equipotential line toward the collector, and an effect to mitigate electric field at the P/N junction on the emitter side is obtained.

A trench depth at which a withstand voltage is improved is hardly dependent on a width of a trench or a mesa, a dummy trench ratio, and impurity concentration. On the other hand, a trench depth at which a withstand voltage is improved is dependent on each impurity depth in trench MOS transistor portion 32, that is, positional relation of a P/N junction formed by p-type body region 2 and n-type impurity diffusion region 14.

Figure 20:
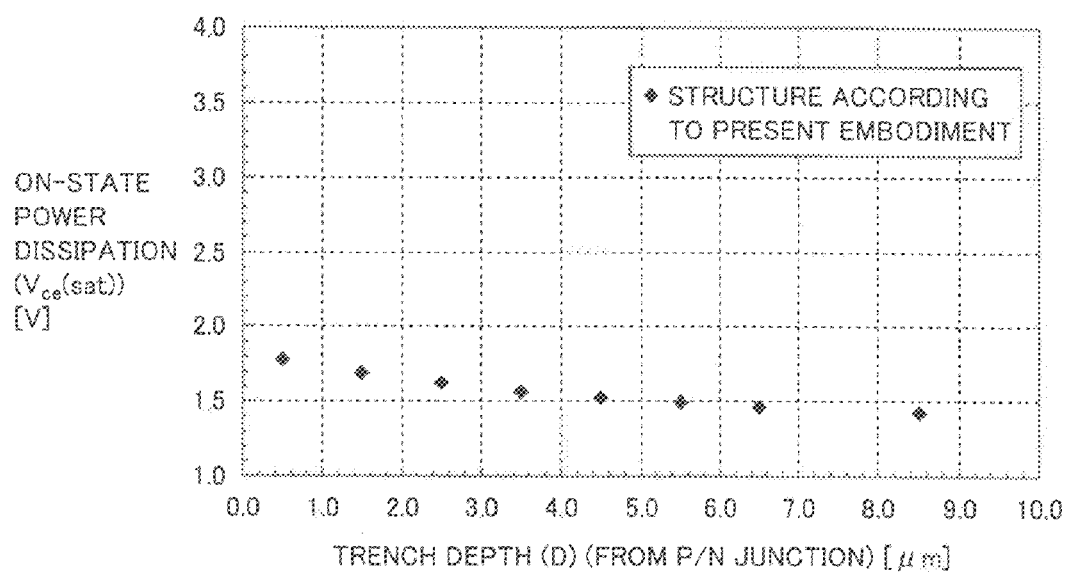
FIG. 20 is a diagram showing relation between a trench depth from a P/N junction and an ON voltage.

By making a trench deeper than 1.5 µm, an effect to lower the ON voltage (Vce(sat)) can be obtained as shown in FIG. 20. For example, by setting the trench depth to 5.5 µm or greater, Vce(sat) can be 1.5 V or lower.

It is noted that the data shown in FIGS. 18 to 20 was evaluated with the dummy trench ratio being set to 0.875, thickness tsub of semiconductor substrate 1 being set to 470 µm, a mesa width ($W_{MOS}$) being set to 1.2 µm, and a trench width ($W_{trench}$) being set to 1.2 µm. Though data at 298 K (25° C.) is representatively shown, similar tendency is exhibited at other temperatures.

(iv) Tip End Shape of Trench Electrode

Referring again to FIG. 3, a cross-sectional shape of a tip end of each of trench for gate 1a and trench for stabilizing plate 1b is set to a rounded shape (for example, a semicircular shape), to thereby improve a withstand voltage. In trench for gate 1a and trench for stabilizing plate 1b having a tip end in an angular shape, electric field concentration is caused at that angular portion and a withstand voltage is lowered. Therefore, a cross-sectional shape of a tip end of each of trench for gate 1a and trench for stabilizing plate 1b is preferably rounded.

Other Embodiments

Figure 21:
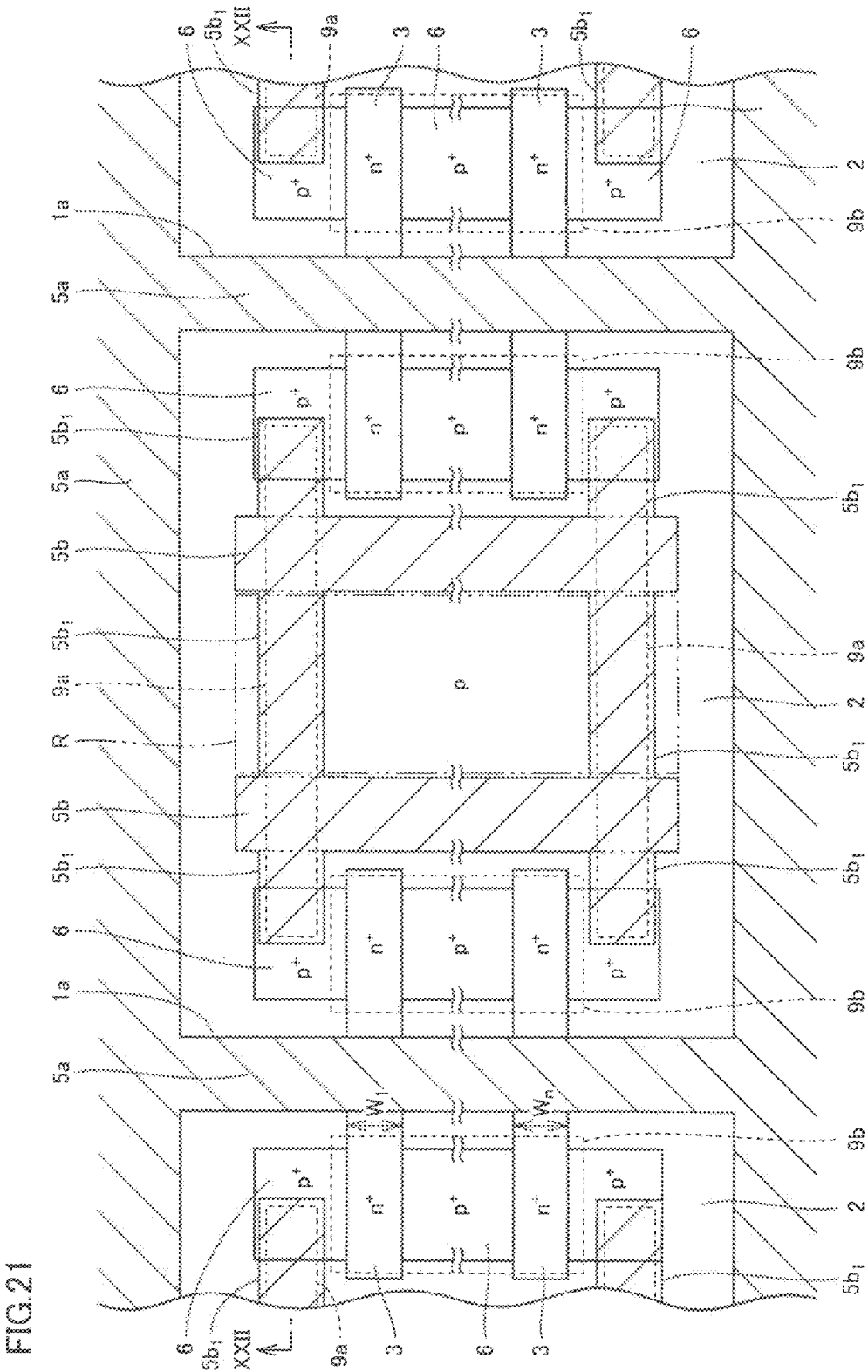
FIG. 21 is a partial plan view schematically showing one variation of a semiconductor device in one embodiment of the present invention, configured such that a contact hole for electrical connection between an emitter electrode and a conductive layer $5b_1$ in a dummy trench is arranged in a region lying between p$^+$ impurity diffusion regions 6.
Figure 23:
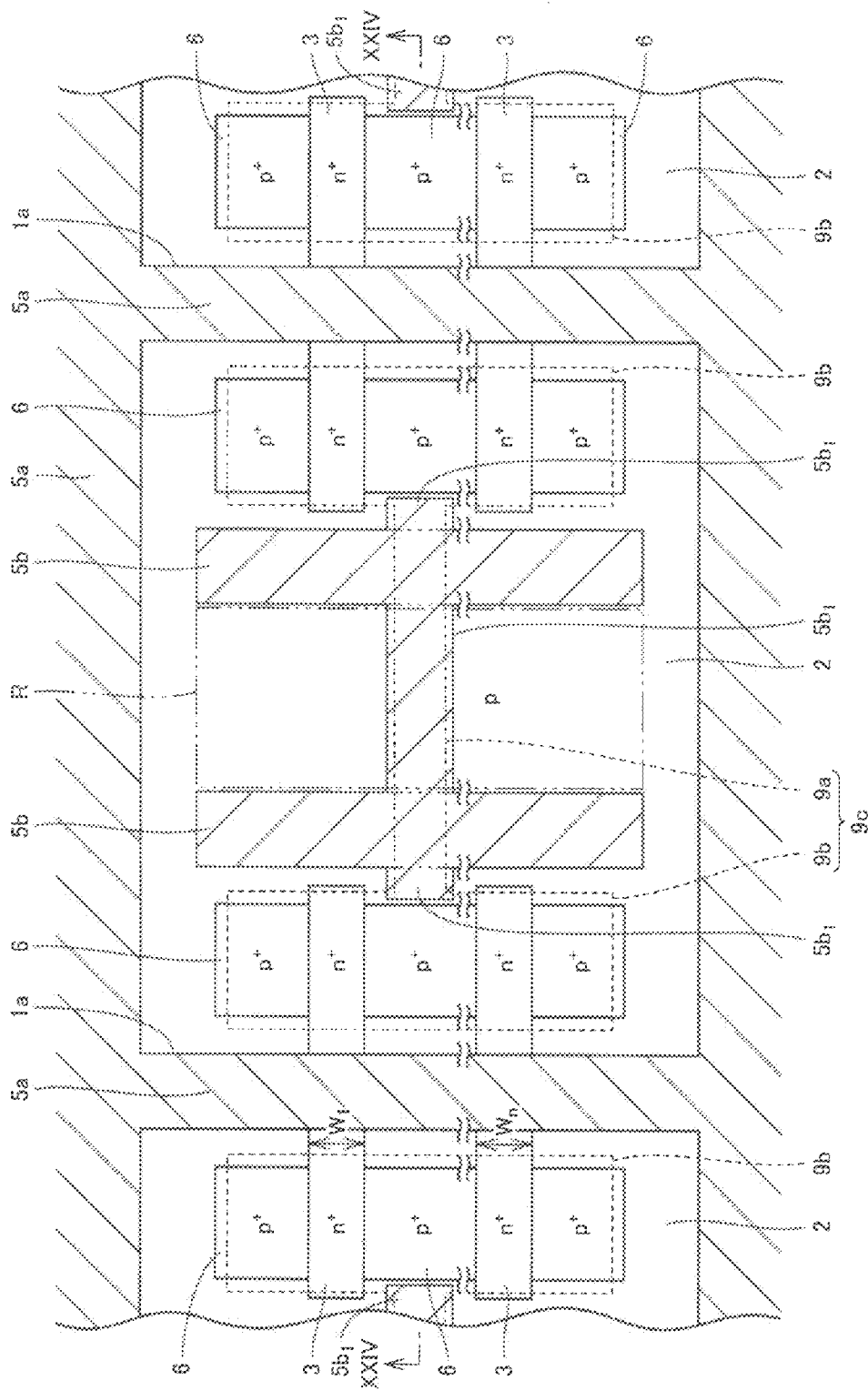
FIG. 23 is a partial plan view schematically showing another variation of a semiconductor device in one embodiment of the present invention, configured such that a contact hole for electrical connection between an emitter electrode and conductive layer $5b_1$ in a dummy trench is arranged in a region lying between p$^+$ impurity diffusion regions 6.

Though a position of arrangement of conductive layer $5b_1$ connecting two stabilizing plates 5b to each other in a two-dimensional view is preferably on the end portion side in the longitudinal direction of gate electrode 5a relative to region Rs as shown in FIG. 2, it may be in region R as shown in FIGS. 21 and 23.

As shown in FIG. 21, conductive layer $5b_1$ may be arranged in a region lying between $p^+$ impurity diffusion regions 6 each at a farthest end portion located at the farthest end portion in the longitudinal direction of n-type emitter region 3 and $p^+$ impurity diffusion region 6 aligned in the longitudinal direction of gate electrode 5a, and a part of conductive layer $5b_1$ may overlap with a part of $p^+$ impurity diffusion region 6 at the farthest end portion when viewed two-dimensionally. A cross-sectional construction of a portion where conductive layer $5b_1$ is formed in this construction is as shown in FIG. 22.

As shown in FIG. 23, conductive layer $5b_1$ may be arranged in a region lying between n-type emitter regions 3 or between $p^+$ impurity diffusion regions 6 other than $p^+$ impurity diffusion region 6 at the farthest end portion of n-type emitter region 3 and $p^+$ impurity diffusion region 6 aligned in the longitudinal direction of gate electrode 5a. In the construction in FIG. 23, conductive layer $5b_1$ is arranged in a region lying between $p^+$ impurity diffusion regions 6 other than $p^+$ impurity diffusion region 6 at the farthest end portion. A cross-sectional construction of a portion where conductive layer $5b_1$ is formed in this construction is as shown in FIG. 24.

Figure 22:
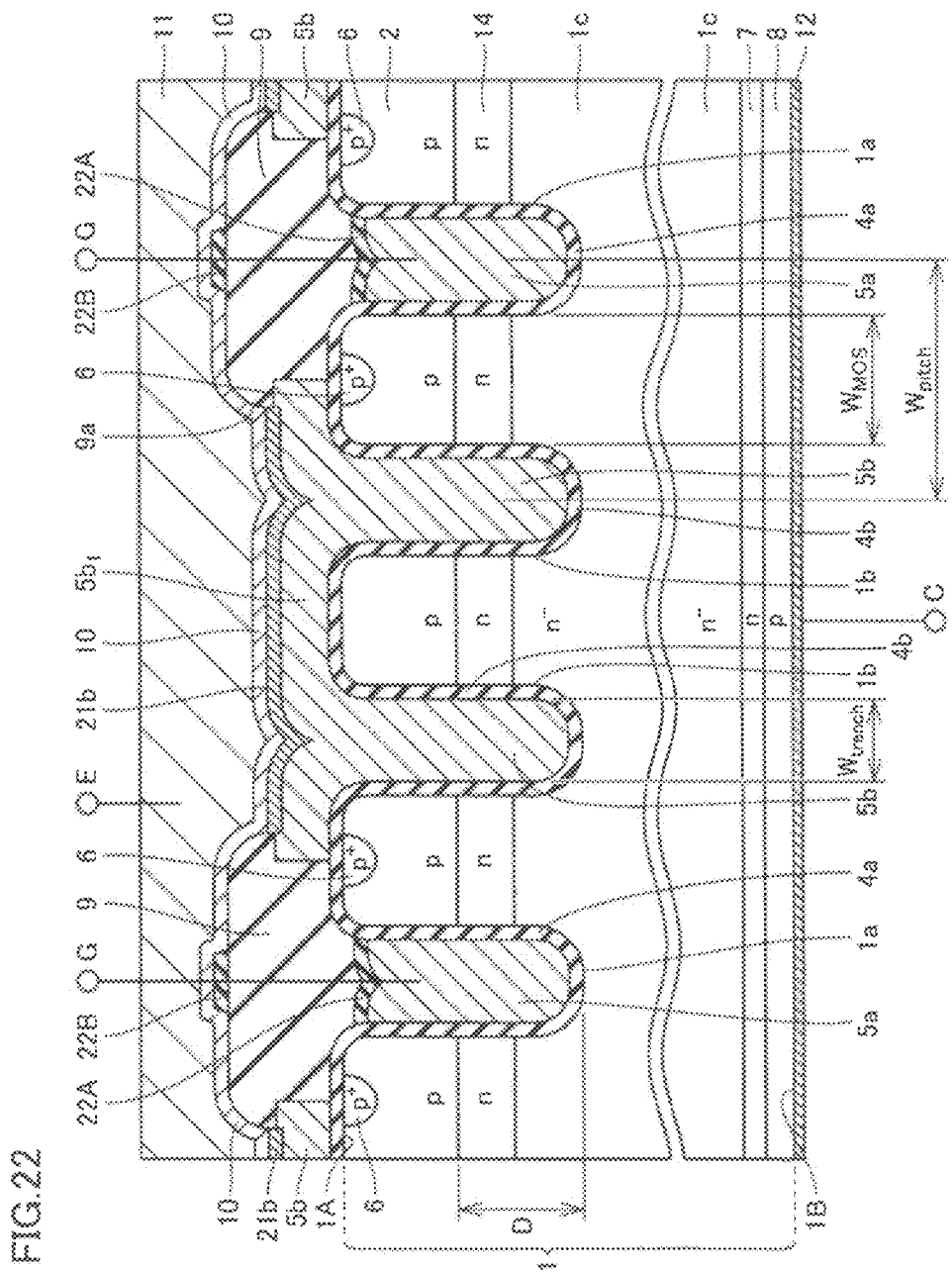
FIG. 22 is a cross-sectional view along the line XXII-XXII in FIG. 21 when viewed in a direction of an arrow.
Figure 24:
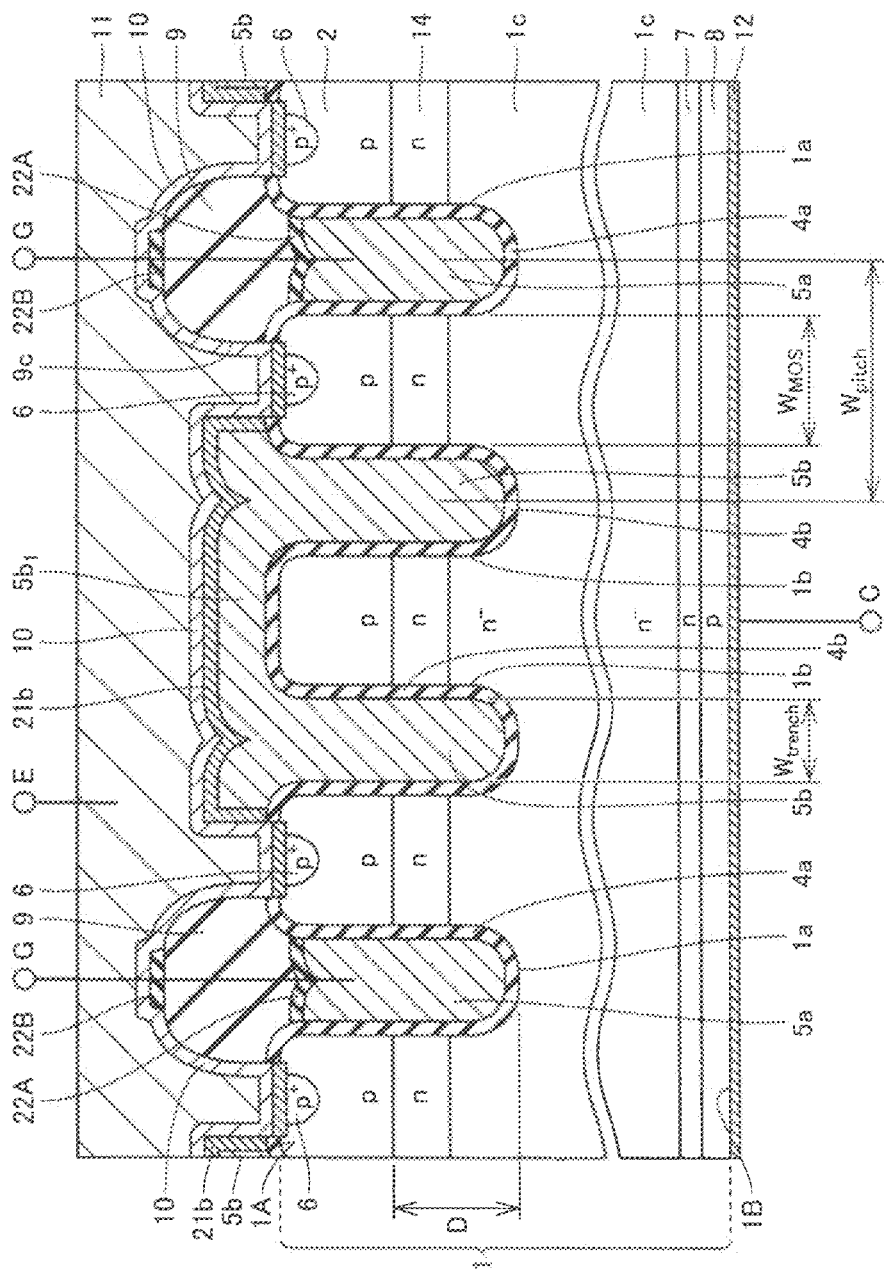
FIG. 24 is a cross-sectional view along the line XXIV-XXIV in FIG. 23 when viewed in a direction of an arrow.

As can be seen in FIGS. 22 and 24, in a case where conductive layer $5b_1$ is in region R above, a width of a region for connecting emitter electrode 11 to first main surface 1A of semiconductor substrate 1 through conductive layer $5b_1$ becomes smaller. In contrast, since conductive layer $5b_1$ is located outside region Rs above in the construction shown in FIGS. 2 to 6, this conductive layer $5b_1$ does not cause decrease in area of a portion where emitter electrode 11 comes in contact with $p^+$ impurity diffusion region 6 and n-type emitter region 3.

Figure 25:
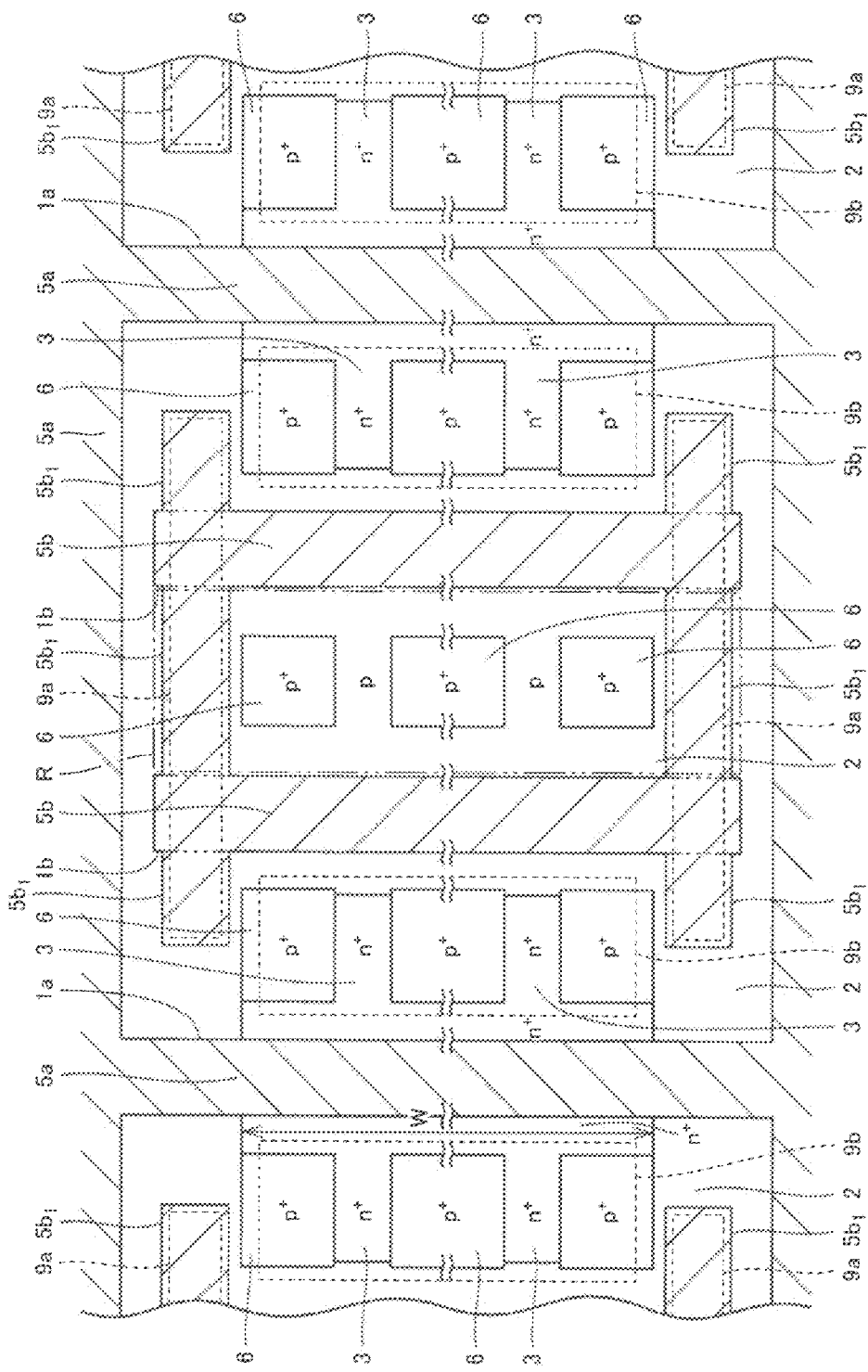
FIG. 25 is a schematic plan view showing a construction of a semiconductor device in another embodiment.

In addition, a pattern structure of n-type emitter region 3 and $p^+$ impurity diffusion region 6 in the two-dimensional view of the semiconductor device in the present embodiment may be such a pattern structure as shown with the conventional structure in FIG. 7, in addition to the pattern shown in FIG. 2. Namely, if contact holes 9a and 9b shown in FIG. 2 are employed instead of contact hole 9d in the conventional structure in FIG. 7, a pattern structure of n-type emitter region 3 and $p^+$ impurity diffusion region 6 shown in the conventional structure in FIG. 7 may be employed. FIG. 25 shows such a construction that contact holes 9a and 9b shown in FIG. 2 are applied to the pattern structure of n-type emitter region 3 and $p^+$ impurity diffusion region 6 shown in this conventional structure in FIG. 7. In this construction in FIG. 25 as well, an effect the same as in the construction shown in FIGS. 2 to 6 can be obtained.

Figure 26:
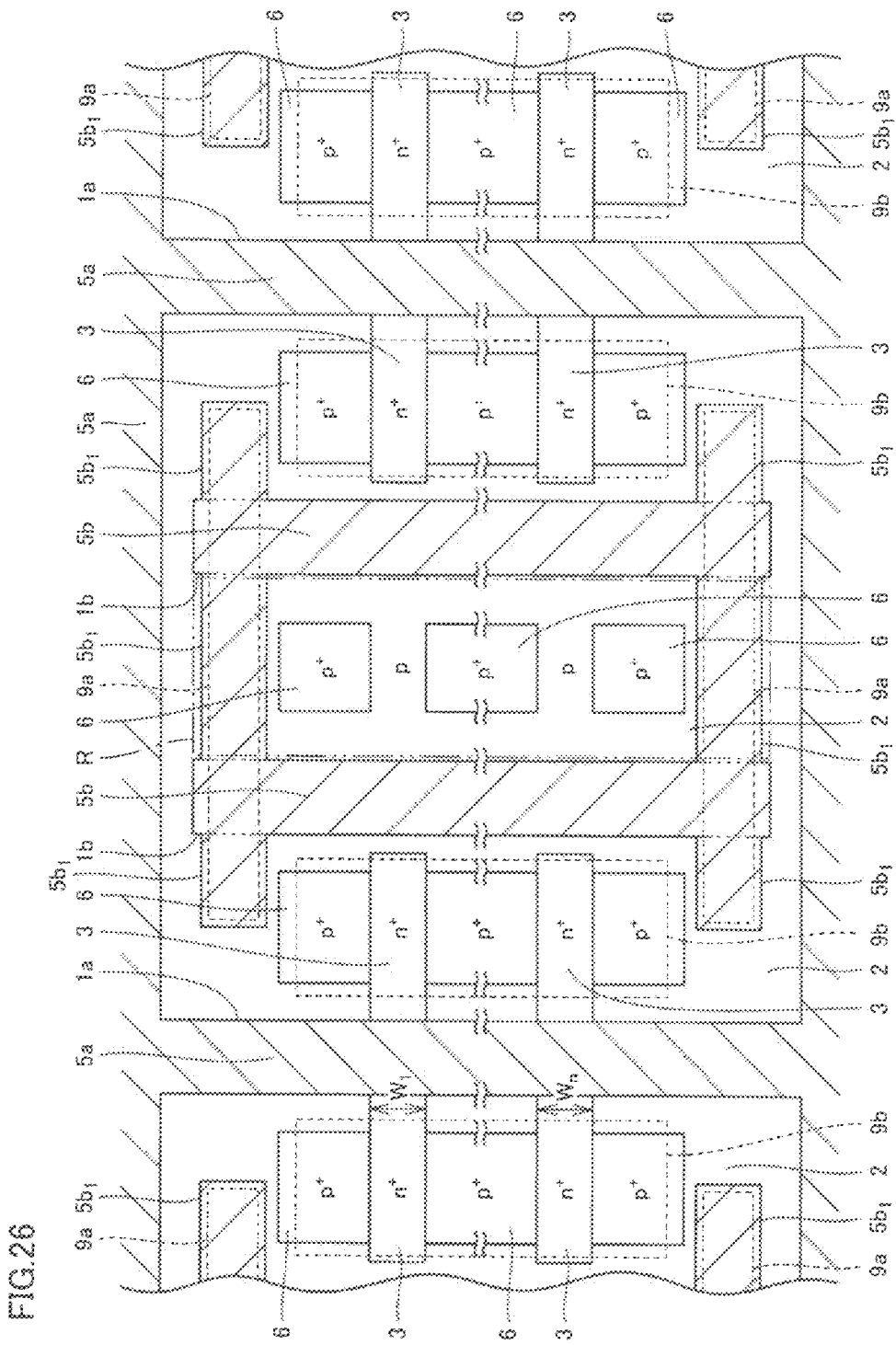
FIG. 26 is a schematic plan view showing a construction of a semiconductor device in yet another embodiment.
Figure 27:
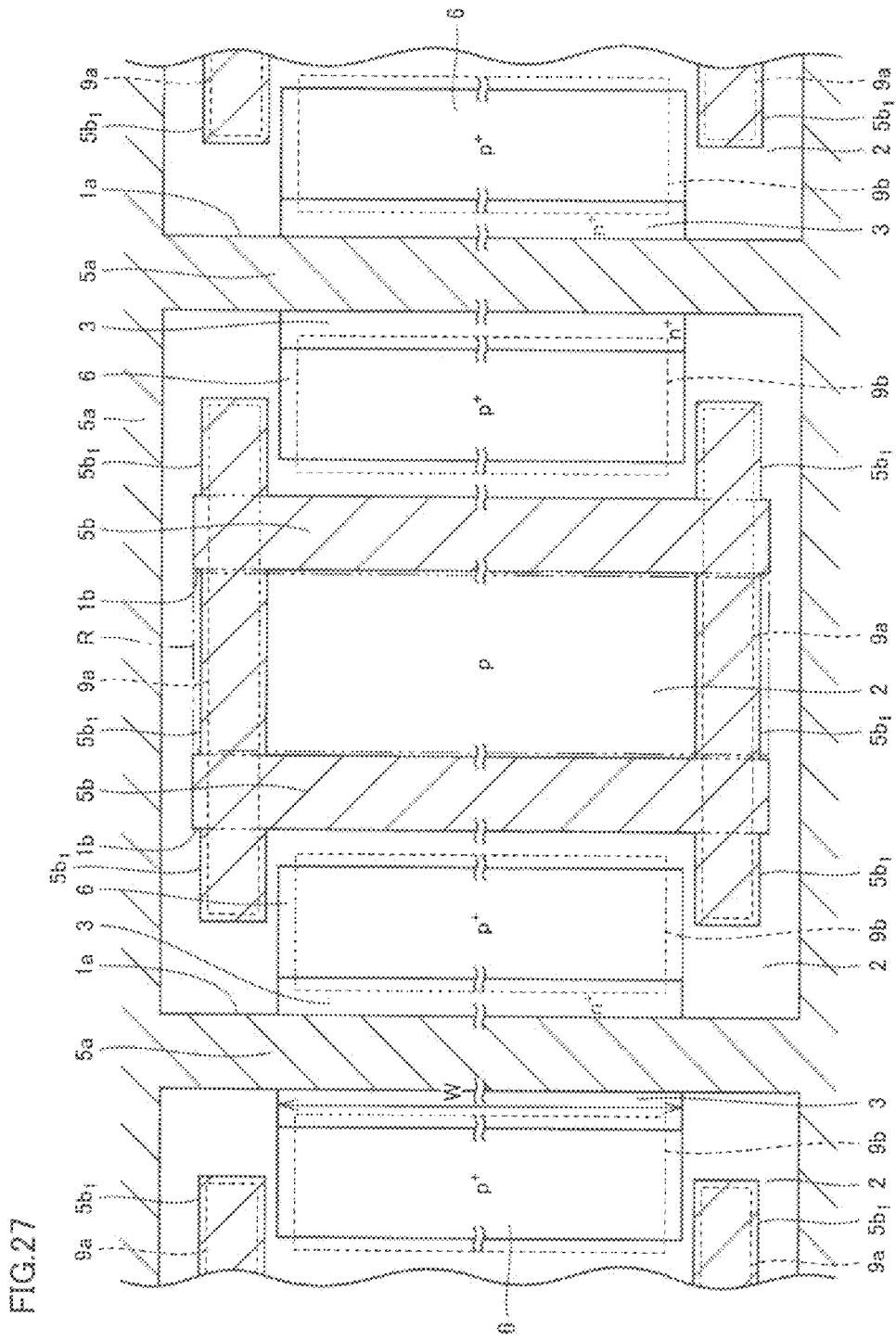
FIG. 27 is a schematic plan view showing a construction of a semiconductor device in yet another embodiment.

Moreover, even when $p^+$ impurity diffusion region 6 as shown in FIG. 26 is present between stabilizing plate 5b and stabilizing plate 5b in the pattern structure shown in FIG. 2, an effect the same as in the construction shown in FIGS. 2 to 6 can be obtained. Further, as shown in FIG. 27, a strip-like pattern structure in which each of n-type emitter region 3 and $p^+$ impurity diffusion region 6 extends along the longitudinal direction of gate electrode 5a in parallel to each other when viewed two-dimensionally can also obtain a similar effect.

Though a MOS transistor portion has been described above by way of example, a material for a gate insulating film is not limited to a silicon oxide film. Therefore, the present invention is applicable to general MIS transistor portions.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   a semiconductor substrate having a first main surface and a second main surface opposed to each other;
   first and second insulated gate field effect transistor portions each having an insulated gate structure on a side of said first main surface and an emitter region of a first conductivity type formed in said first main surface, for allowing a main current to flow between said first main surface and said second main surface;
   a stabilizing plate portion formed in a region in said first main surface lying between said first and second insulated gate field effect transistor portions; and
   an emitter electrode provided on said first main surface,
   said stabilizing plate portion including a first stabilizing plate arranged closest to said first insulated gate field effect transistor portion and a second stabilizing plate arranged closest to said second insulated gate field effect transistor portion,
   said emitter electrode being electrically connected to said emitter region of each of said first and second insulated gate field effect transistor portions, electrically connected to each of said first and second stabilizing plates, and arranged on entire said first main surface lying between said first and second stabilizing plates with an insulating layer being interposed, wherein
   each of said first and second insulated gate field effect transistor portions includes a body contact region of a second conductivity type formed in the first main surface of said semiconductor substrate and a gate electrode, and
   said emitter electrode is electrically connected to each of said first and second stabilizing plates in an end region located on an end portion side in a longitudinal direction of said gate electrode in a plan view, relative to a region lying between a region in said first insulated gate field effect transistor portion where said emitter region and the body contact region are formed and a region in said second insulated gate field effect transistor portion where said emitter region and the body contact region are formed.

2. The semiconductor device according to claim 1, further comprising a conductive layer extending over said first main surface with said insulating layer being interposed, so as to connect said first and second stabilizing plates to each other, wherein
   said conductive layer is located in said end region.

3. The semiconductor device according to claim 1, further comprising a first conductivity type region formed inside said semiconductor substrate and a body region of the second conductivity type formed on the side of said first main surface of said first conductivity type region and being lower in concentration of an impurity of the second conductivity type than said body contact region, wherein
   each of said first and second stabilizing plates is formed to bury inside of a trench for stabilizing plate formed to reach said first conductivity type region from said first main surface of said semiconductor substrate through said body region, and
   said gate electrode of each of said first and second insulated gate field effect transistor portions is formed to bury inside of a trench for gate formed to reach said first conductivity type region from said first main surface of said semiconductor substrate through said body region.

4. The semiconductor device according to claim 3, wherein a dummy trench ratio is not lower than 0.5 and not higher than 0.92, where the dummy trench ratio is defined as a value calculated by dividing the number of said trenches for stabilizing plate by a total of the number of said trenches for gate and the number of said trenches for stabilizing plate.

5. The semiconductor device according to claim 3, wherein a depth of said trench for gate and a depth of said trench for stabilizing plate are each not smaller than 1.5 vim from a junction portion between said first conductivity type region and said body region toward a side of said second main surface.

6. The semiconductor device according to claim 3, wherein a tip end of said trench for gate and a tip end of said trench for stabilizing plate are each in a rounded shape.

7. The semiconductor device according to claim 3, wherein a plurality of trenches including said trench for stabilizing plate and said trench for gate are identical to one another in pitch.

8. The semiconductor device according to claim 3, wherein said first conductivity type region includes a first region of the first conductivity type and a second region of the first conductivity type formed on the side of said first main surface relative to said first region and being higher in concentration of an impurity of the first conductivity type than said first region, and both of said trench for stabilizing plate and said trench for gate are formed to reach said first region through said second region.

9. The semiconductor device according to claim 3, further comprising a second conductivity type region formed in said first main surface between said first stabilizing plate and said second stabilizing plate and being higher in concentration of an impurity of the second conductivity type than said body region.

10. A semiconductor device, comprising:

a semiconductor substrate having a first main surface and a second main surface opposed to each other;

first and second insulated gate field effect transistor portions each having an insulated gate structure on a side of said first main surface and an emitter region of a first conductivity type formed in said first main surface, for allowing a main current to flow between said first main surface and said second main surface;

a stabilizing plate portion formed in a region in said first main surface lying between said first and second insulated gate field effect transistor portions; and an emitter electrode provided on said first main surface, said stabilizing plate portion including a first stabilizing plate arranged closest to said first insulated gate field effect transistor portion and a second stabilizing plate arranged closest to said second insulated gate field effect transistor portion, and said emitter electrode being electrically connected to said emitter region of each of said first and second insulated gate field effect transistor portions, electrically connected to each of said first and second stabilizing plates, and arranged on entire said first main surface lying between said first and second stabilizing plates with an insulating layer being interposed, wherein each of said first and second insulated gate field effect transistor portions includes a gate electrode formed in the first main surface of said semiconductor substrate and a plurality of body contact regions of a second conductivity type, in each of said first and second insulated gate field effect transistor portions, said plurality of body contact regions are aligned in a longitudinal direction of said gate electrode in a plan view, and said emitter electrode is electrically connected to each of said first and second stabilizing plates in a region including at least a region lying between said body contact region arranged at a farthest end portion in the longitudinal direction of said gate electrode of said first insulated gate field effect transistor portion in a plan view and said body contact region arranged at a farthest end portion in the longitudinal direction of said gate electrode of said second insulated gate field effect transistor portion in a plan view.

11. A semiconductor device, comprising:

a semiconductor substrate having a first main surface and a second main surface opposed to each other;

first and second insulated gate field effect transistor portions each having an insulated gate structure on a side of said first main surface and an emitter region of a first conductivity type formed in said first main surface, for allowing a main current to flow between said first main surface and said second main surface;

a stabilizing plate portion formed in a region in said first main surface lying between said first and second insulated gate field effect transistor portions; and an emitter electrode provided on said first main surface, said stabilizing plate portion including a first stabilizing plate arranged closest to said first insulated gate field effect transistor portion and a second stabilizing plate arranged closest to said second insulated gate field effect transistor portion, and said emitter electrode being electrically connected to said emitter region of each of said first and second insulated gate field effect transistor portions, electrically connected to each of said first and second stabilizing plates, and arranged on entire said first main surface lying between said first and second stabilizing plates with an insulating layer being interposed, wherein each of said first and second insulated gate field effect transistor portions includes a gate electrode formed in the first main surface of said semiconductor substrate and a plurality of body contact regions of a second conductivity type, in each of said first and second insulated gate field effect transistor portions, said plurality of body contact regions are aligned in a longitudinal direction of said gate electrode in a plan view, and said emitter electrode is electrically connected to each of said first and second stabilizing plates in a region lying between said body contact region other than said body contact region arranged at a farthest end portion among said plurality of body contact regions aligned in the longitudinal direction of said gate electrode of said first insulated gate field effect transistor portion in a plan view and said body contact region other than said body contact region arranged at a farthest end portion among said plurality of body contact regions aligned in the longitudinal direction of said gate electrode of said second insulated gate field effect transistor portion in a plan view.

* * * * *